(12) United States Patent
Chang

(10) Patent No.: US 12,080,656 B2
(45) Date of Patent: Sep. 3, 2024

(54) ELECTROMAGNETIC SHIELDING STRUCTURE FOR A SEMICONDUCTOR DEVICE AND A METHOD FOR MANUFACTURING THE SAME

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/173,840

(22) Filed: Feb. 24, 2023

(65) Prior Publication Data

US 2023/0207484 A1    Jun. 29, 2023

Related U.S. Application Data

(62) Division of application No. 17/301,327, filed on Mar. 31, 2021, now Pat. No. 11,594,497.

(51) Int. Cl.
*H01L 23/552* (2006.01)
*H01L 23/52* (2006.01)

(52) U.S. Cl.
CPC .................................. *H01L 23/552* (2013.01)

(58) Field of Classification Search
CPC ... H01L 28/10; H01L 23/552; H01L 23/5225; H01L 23/5227; H01L 2224/08265; H01L 2924/19042; H01L 2924/30107; H01L 2924/3025; H01L 23/60; H01L 2924/19104
USPC .......................................................... 257/659
See application file for complete search history.

(56) References Cited

U.S. PATENT DOCUMENTS

| | | |
|---|---|---|
| 8,597,979 B1 | 12/2013 | Burgyan |
| 11,594,497 B2 | 2/2023 | Chang |
| 2007/0221399 A1* | 9/2007 | Nishizawa ............... H01L 24/97 174/250 |
| 2008/0020488 A1* | 1/2008 | Clevenger ............. H01L 23/481 438/3 |
| 2011/0205709 A1 | 8/2011 | Yin et al. |
| 2015/0108603 A1* | 4/2015 | Yen ..................... H01L 23/5227 438/381 |
| 2015/0173258 A1 | 6/2015 | Chen et al. |
| 2017/0179039 A1 | 6/2017 | Lee et al. |
| 2017/0263571 A1* | 9/2017 | Ishihara ................ H01L 23/552 |
| 2018/0007818 A1 | 1/2018 | Toleno et al. |
| 2018/0075965 A1* | 3/2018 | Yoshioka ............ H01F 27/2823 |
| 2020/0161252 A1* | 5/2020 | Yang ..................... H01L 21/561 |
| 2021/0249503 A1* | 8/2021 | Schmidt ................ H01L 23/481 |

* cited by examiner

*Primary Examiner* — Didarul A Mazumder
(74) *Attorney, Agent, or Firm* — Harrity & Harrity, LLP

(57) ABSTRACT

A semiconductor device includes an inductance structure and a shielding structure. The shielding structure is arranged to at least partially shield the inductance structure from external electromagnetic fields. The shielding structure includes a shielding structure portion arranged along a side of the inductance structure such that the shielding structure portion is around at least a portion of a perimeter of the inductance structure.

20 Claims, 40 Drawing Sheets

ELECTROMAGNETIC SHIELDING STRUCTURE FOR A SEMICONDUCTOR DEVICE AND A METHOD FOR MANUFACTURING THE SAME

RELATED APPLICATION

This application is a divisional of U.S. patent application Ser. No. 17/301,327, filed Mar. 31, 2021 (now U.S. Pat. No. 11,594,497), which is incorporated herein by reference in its entirety.

BACKGROUND

A semiconductor device may include an inductance structure (also referred to as an inductance die or an inductance circuit). The inductance structure is a passive two-terminal component designed to store energy in a magnetic field when current flows through the inductance structure. For example, when a current flowing through the inductance structure changes, a time-varying magnetic field induces an electromotive force (i.e., a voltage) in the inductance structure. The induced voltage has a polarity which opposes the change in the current that created the induced voltage. As a result, the inductance structure opposes changes in current flowing through the inductance structure. These characteristics of an inductance structure permit the inductance structure to be used to, for example, reduce noise in a current or to stabilize the current in a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
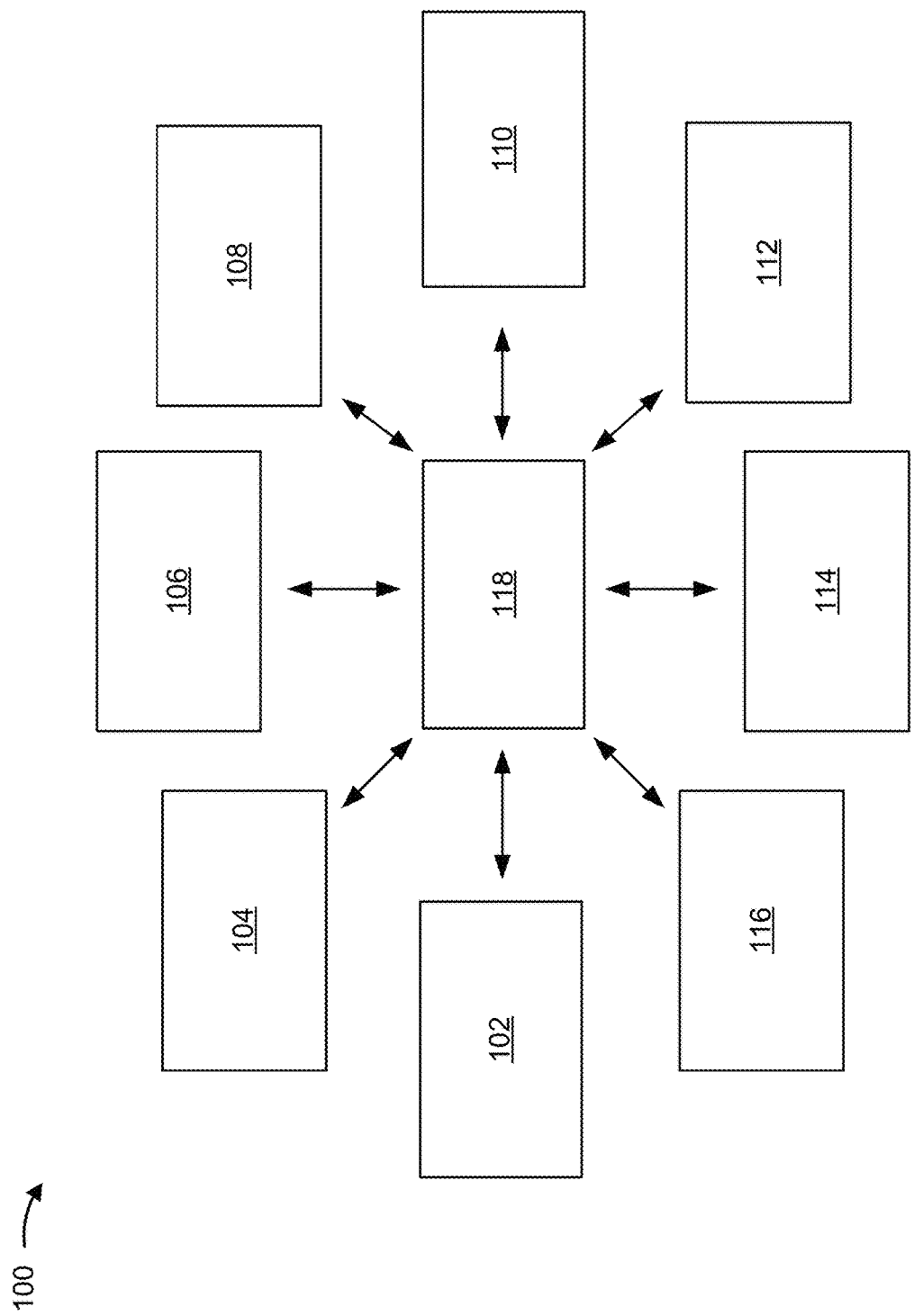
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "over," "under," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, an inductance structure of a semiconductor device may be in a position at which one or more external electromagnetic (EM) fields are or can be present. The inductance structure may not be adequately shielded from the external EM fields and, as a result, the external EM fields can induce unwanted charges in the inductance structure. The induced charges in the inductance structure degrade performance of the inductance structure. For example, the induced charges may degrade performance of the inductance structure with respect to noise reduction or current stabilization provided by the inductance structure, thereby causing the current in the semiconductor device to be unstable or unreliable.

Some implementations described herein provide techniques and apparatuses for a semiconductor device that includes a shielding structure for an inductance structure. In some implementations, the semiconductor device includes an inductance structure and a shielding structure, where the shielding structure is arranged to at least partially shield the inductance structure from external EM fields. For example, in some implementations, the shielding structure includes a shielding structure portion arranged along a side of the inductance structure such that the shielding structure portion is around at least a portion of a perimeter of the inductance structure. In this way, the shielding structure at least partially shields the inductance structure from the external EM fields, thereby improving performance of the inductance structure. For example, the shielding structure may improve performance of the inductance structure with respect to noise reduction or current stabilization provided by the inductance structure, meaning that stability or reliability of the current in the semiconductor device is improved (as compared to a semiconductor device that does not include the shielding structure). Additional details are provided below.

FIG. 1 is a diagram of an example environment 100 in which systems and/or methods described herein may be implemented. As shown in FIG. 1, environment 100 may include a plurality of semiconductor processing tools 102-116 and a wafer/die transport tool 118. The plurality of semiconductor processing tools 102-116 may include a deposition tool 102, an exposure tool 104, a developer tool 106, an etch tool 108, a planarization tool 110, an ion implantation tool 112, a thermal processing tool 114, a plating tool 116, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing or otherwise growing various types of materials. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes a tool capable of facilitating growth a material using a soaking process (e.g., a silane soaking process, a disilane soaking process). In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, an atomic layer etch (ALE) and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 112 is a semiconductor processing tool that is capable of implanting ions into one or more layers of a wafer or semiconductor device. The ion implantation tool 112 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the wafer or semiconductor device such that the ions are implanted below the surface of the wafer or semiconductor device.

The thermal processing tool 114 is a semiconductor processing tool that is capable of heating a wafer or semiconductor device in order to affect electrical properties of the wafer or semiconductor device. For example, the thermal processing tool 114 may heat the wafer or semiconductor device to activate dopants, change film-to-film or film-to-wafer interfaces, densify deposited films, change states of grown films, repair damage from ion implantation, or move dopants or drive dopants from one film into another or from a film into the semiconductor device, among other examples. In some implementations, the thermal processing tool 114 may be capable of performing rapid thermal processing (RTP) (e.g., rapid thermal annealing (RTA)) in which the wafer or semiconductor device is heated to a high temperature (e.g., over 1000 degrees Celsius (° C.)) on a short timescale (e.g., several seconds or less). Using such a technique, the wafer or semiconductor device can be processed in a short time (e.g., several minutes). The thermal processing tool 114 may generate heat for heating the wafer or semiconductor device using, for example, a high intensity lamp, a laser, a hot chuck, or a hot plate, among other examples.

The plating tool 116 is a semiconductor processing tool that is capable of plating a substrate (e.g., a wafer, a semiconductor device, and/or the like) or a portion thereof with one or more metals. For example, a plating tool may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or the like. Plating, and particularly electroplating (or electro-chemical deposition), is a process by which conductive structures are formed. Plating may include applying a voltage across an anode formed of a plating material and a cathode (e.g., a substrate). The voltage causes a current to oxidize the anode, which causes the release of plating material ions from the anode. These plating material ions form a plating solution that travels through a plating bath toward the substrate. The plating solution reaches the substrate and deposits plating material ions into trenches, vias, interconnects, and/or other structures in and/or on the substrate Wafer/die transport tool 118 includes a mobile robot, a robot arm, a tram or rail car, an overhead hoist transport (OHT) system, an automated materially handling system (AMHS), and/or another type of device that is used to transport wafers and/or dies between semiconductor processing tools 102-116 and/or to and from other locations such as a wafer rack, a storage room, and/or the like. In some implementations, wafer/die transport tool 118 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
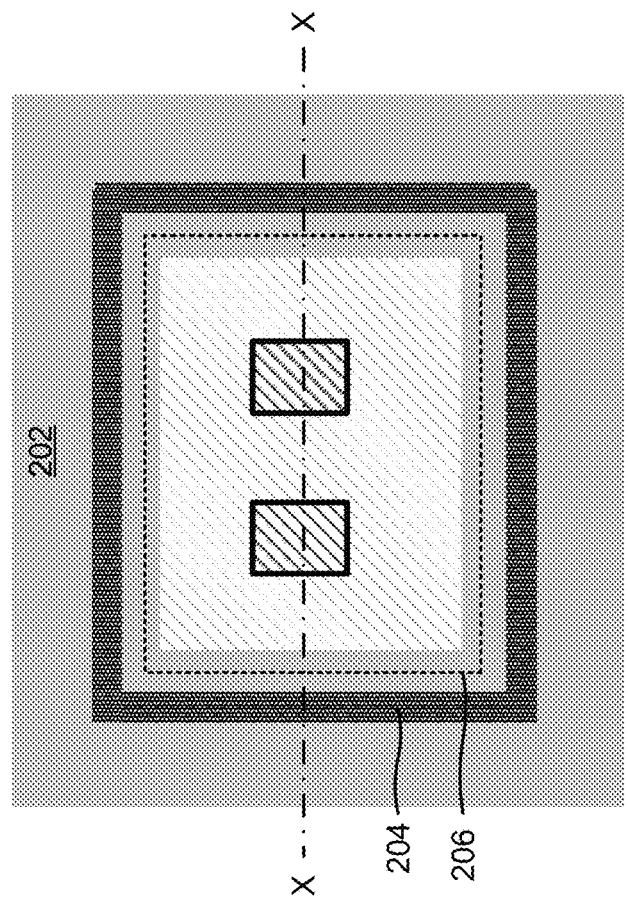
FIGS. 2A and 2B are diagrams of an example semiconductor device described herein.
Figure 2B:
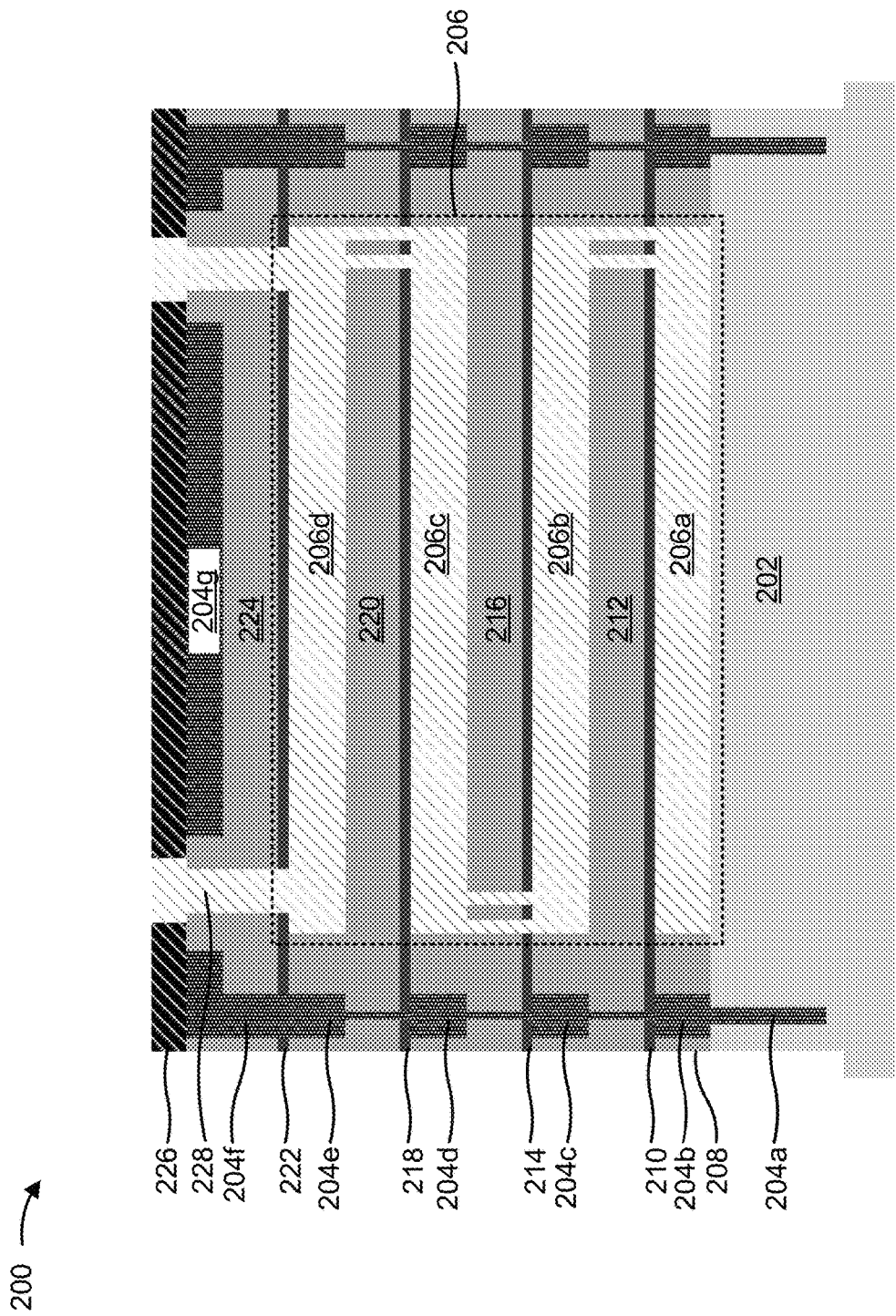

FIGS. 2A and 2B are diagrams of an example semiconductor device 200. FIG. 2A is a diagram of an example top view of the semiconductor device 200, while FIG. 2B is a diagram of an example cross-sectional view of the semiconductor device 200 along line X identified in FIG. 2A.

As shown in FIG. 2A, the semiconductor device 200 includes a substrate 202, a shielding structure 204, and an inductance structure 206. The shielding structure 204 includes a structure to at least partially shield the inductance structure 206 from external EM fields. In some implementations, the shielding structure 204 may be formed from or include one or more conductive material, such as metals (e.g., copper, aluminum, or silver, among other examples), TaN, TiN or one or more other types of material with physical properties that provide a desirable or acceptable effectiveness for absorbing, suppressing, or reflecting EM radiation. Notably, the top view shown in FIG. 2A includes vertical portions of the shielding structure 204 only (e.g., portions of the shielding structure 204 arranged along sides of the inductance structure 206). While not shown in FIG. 2A, the shielding structure 204 in some implementations includes one or more horizontal portions (e.g., portions arranged along a top or a bottom of the inductance structure 206), as described in further detail below.

In some implementations, to provide shielding for the inductance structure 206, a portion of the shielding structure 204 is arranged along a side of the inductance structure 206 such that the portion of the shielding structure 204 is around at least a portion of a perimeter of the inductance structure 206. For example, as shown in FIG. 2A, a portion of the shielding structure 204 may be arranged such that the portion of the shielding structure 204 is along all sides of the inductance structure 206 (e.g., such that the portion of the shielding structure 204 is around the entire perimeter of the inductance structure 206). In some implementations, such an arrangement improves EM shielding provided by the shielding structure 204 (e.g., as compared to a shielding structure 204 that is not present or is present and is not around the entire perimeter of the inductance structure 206).

In some implementations, the shielding structure 204 includes a shielding structure portion that is along at least a portion of one or more sides of the inductance structure 206. For example, as shown in FIG. 2A, the shielding structure 204 may include a single portion that is along a full length of each side of the inductance structure 206 (e.g., such that the single portion of the shielding structure 204 is wrapped around the inductance structure 206). As another example, the shielding structure 204 may include a single portion along a length of one or more sides (e.g., three sides) of the inductance structure 206 (e.g., such that the single portion of the shielding structure 204 is wrapped around only a portion of the perimeter of the inductance structure 206). In some implementations, the shielding structure 204 includes multiple portions, and each portion of the shielding structure 204 is along at least a portion of one or more sides of the inductance structure 206. For example, the shielding structure 204 may include a first portion that is along a first side of the inductance structure 206 and a second side of the inductance structure 206, and a second portion that is along a third side of the inductance structure 206 and fourth side of the inductance structure 206. In some implementations, the shielding structure 204 being continuous around the entire perimeter of the inductance structure 206 provides shielding of the inductance structure 206 in all directions, thereby increasing a efficacy of the shielding provided for the inductance structure 206. As another example, the shielding structure 204 may include a first portion that is along a first side of the inductance structure 206, a second portion that is along a second side of the inductance structure 206, and a third portion that is along a portion of a third side of the inductance structure 206—in this example, the shielding structure 204 is not present along a fourth side of the inductance structure 206. In some implementations, the shielding structure 204 not being continuous around the perimeter of the inductance structure 206 may provide adequate shielding for the inductance structure 206 and may be comparatively less costly to manufacture (e.g., as compared to a shielding structure 204 that surrounds the entire perimeter of the inductance structure 206). In some implementations, the degree to which the shielding structure 204 is around the perimeter of the inductance structure 206 may be selected so as to provide an acceptable amount of shielding, shielding in a particular direction, or in another manner. In some implementations, the shielding structure 204 being around fewer than all sides of the inductance structure 206, or shielding only a portion of one or more sides of the inductance structure 206 may provide adequate shielding for the inductance structure 206 and may be comparatively less costly to manufacture (e.g., as compared to a shielding structure 204 that surrounds the entire perimeter of the inductance structure 206).

FIG. 2B is a cross-sectional view of the semiconductor device 200 along the line X identified in FIG. 2A. As shown in FIG. 2B, the semiconductor device 200 includes the substrate 202, the shielding structure 204, and the inductance structure 206. As further shown, the shielding structure 204 includes shielding structure layers 204a through 204g, and the inductance structure 206 includes inductance structure layers 206a through 206d. As further shown, the semiconductor device 200 includes a dielectric layer 208, an etch stop layer 210, a dielectric layer 212, an etch stop layer 214, a dielectric layer 216, an etch stop layer 218, a dielectric layer 220, an etch stop layer 222, a dielectric layer 224, a passivation layer 226, and connective structures 228.

The substrate 202 may include a semiconductor die substrate, a semiconductor wafer, or another type of substrate in which the semiconductor device 200 may be formed. In some implementations, the substrate 202 is formed of silicon, a material including silicon, a III-V compound semiconductor material such as gallium arsenide (GaAs), a silicon on insulator (SOI), or another type of semiconductor material.

As described above, the shielding structure 204 is a structure to provide shielding for the inductance structure 206 (e.g., to at least partially prevent electrical charges from being induced in the inductance structure 206 by external EM fields). As shown in FIG. 2B, a portion of the shielding structure 204 is, in some implementations, arranged along one or more sides of the inductance structure 206. For example, a portion of the shielding structure 204 formed by shielding structure layers 204*a*-204*f* may be arranged along one or more sides of the inductance structure 206 (e.g., such that the portion of the shielding structure 204 is around the perimeter of the inductance structure 206, as shown in the top view in FIG. 2A).

In some implementations, a portion of the shielding structure 204 is arranged above a first surface of the inductance structure 206. For example, as shown in FIG. 2B, a portion of the shielding structure 204 formed by shielding structure layer 204*g* may be arranged above a top surface of the inductance structure 206 (a top surface according to the orientation of the semiconductor device 200 in FIG. 2B). In some implementations, as shown in FIG. 2B, the portion of the shielding structure 204 above the inductance structure 206 includes openings through which connective structure 228 (e.g., used for electrically connecting the inductance structure 206 to another semiconductor device) are arranged.

Similarly, in some implementations, a portion of the shielding structure 204 is arranged below a second surface of the inductance structure 206. For example, a portion of the shielding structure 204 formed from a shielding structure layer 204*h* (shown in FIG. 4) may be below a bottom surface of the inductance structure 206 (a bottom surface according to the orientation of the semiconductor device 200 in FIG. 2B). In some implementations, the portion of the shielding structure 204 below the inductance structure 206 may be electrically connected via one or more connective structures to ground (e.g., to dissipate an electric charge on the shielding structure 204) or to a reverse voltage source (e.g., to neutralize an electric charge on the shielding structure 204), as described in further detail below.

The inductance structure 206 includes a structure to store energy in a magnetic field as current flows through the inductance structure 206. For example, when a current flowing through the inductance structure 206 changes, a time-varying magnetic field induces a charge in the inductance structure 206. The induced charge has a polarity which opposes the change in the current. As a result, the inductance structure 206 opposes changes in current flowing through the inductance structure 206. These characteristics of an inductance structure permit the inductance structure 206 to be used to, for example, reduce noise in a current or to stabilize the current in the semiconductor device 200. In some implementations, the inductance structure 206 may be formed from or include a conductive material, such as a metal (e.g., copper, aluminum, or silver, among other examples)

In some implementations, the inductance structure 206 and the shielding structure 204 may be formed from the same material. Therefore, a given layer of the shielding structure 204 and a corresponding layer of the inductance structure 206 may be formed concurrently (e.g., during the same series of processing steps). For example, the shielding structure layer 204*b* may be formed during a same series of processing steps used to form the inductance structure layer 206*a*. Similarly, the shielding structure layer 204*e* may be formed during a same series of processing steps used to form the inductance structure layer 206*d*. As a result, formation of the shielding structure 204 does not significantly increase a number of processing steps associated with forming the inductance structure 206.

A dielectric layer 2*xx* (corresponding to the dielectric layer 208, the dielectric layer 212, the dielectric layer 216, the dielectric layer 220, or the dielectric layer 224) includes a layer that provides isolation for other components of the semiconductor device 200. For example, the dielectric layer 2*xx* may be formed from a material that provides electrical isolation between metal layers (e.g., between shielding structure layers 204 and inductance structure layers 206) of the semiconductor device 200 or between the semiconductor device 200 and an adjacent semiconductor device 200. In some implementations, the dielectric layer 2*xx* may be formed from, for example, silicon dioxide ($SiO_2$), fluorine-doped $SiO_2$ (also referred to as fluorinated silica glass or fluorosilicate glass), carbon-doped $SiO_2$ (also referred to as organosilicate glass), or another type of dielectric material.

An etch stop layer 2*xx* (corresponding to the etch stop layer 210, the etch stop layer 214, the etch stop layer 218, or the etch stop layer 222) includes a layer to protect one or more lower layers (e.g., one or more layers below the etch stop layer 2*xx*) of the semiconductor device 200 and/or indicate an etch endpoint associated with formation of a recess in the semiconductor device 200. In some implementations, the etch stop layer 2*xx* may be formed from, for example, silicon nitride (SiN) or silicon carbonitride (SiCN), among other examples.

The passivation layer 226 includes a layer to protect other (lower) layers or features of the semiconductor device 200 from damage. In some implementations, the passivation layer 226 may be formed after completion of the inductance structure 206 and a portion of the shielding structure 204. In some implementations, the passivation layer 226 may be formed from, for example, SiO2, a SiN bi-layer, another type of oxide or nitride material, or another material suitable for protecting other layers or features of the semiconductor device 200 from damage.

The connective structures 228 include structures to permit the inductance structure 206 of the semiconductor device 200 to be electrically connected to another semiconductor device. For example, the connective structures 228 may be connected to another semiconductor device to permit the inductance structure 206 to provide current noise reduction or stabilization for a current flowing through the other semiconductor device. In some implementations, the connective structures 228 may be formed from a conductive material, such as a metal (e.g., copper, aluminum, or silver, among other examples).

As indicated above, FIGS. 2A and 2B are provided as examples. Other examples may differ from what is described with regard to FIGS. 2A and 2B. For example, the shielding structure 204 of the semiconductor device 200 may include additional shielding structure layers 204, additional inductance structure layers 206, fewer shielding structure layers 204, fewer inductance structure layers 206, differently arranged shielding structure layers 204, or differently arranged inductance structure 206 than shown in FIG. 2B.

Figure 3A:
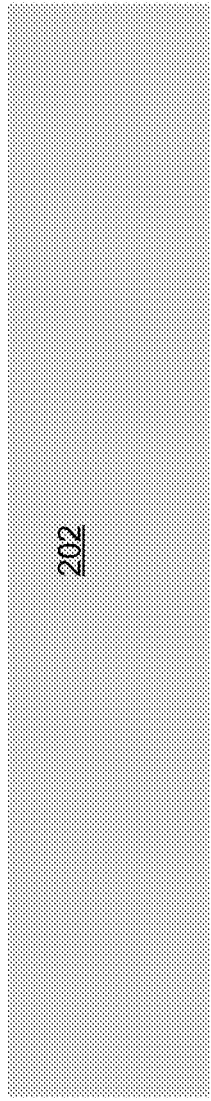
FIGS. 3A-3U are diagrams of an example implementation described herein.
Figure 3A:
Figure 3B:
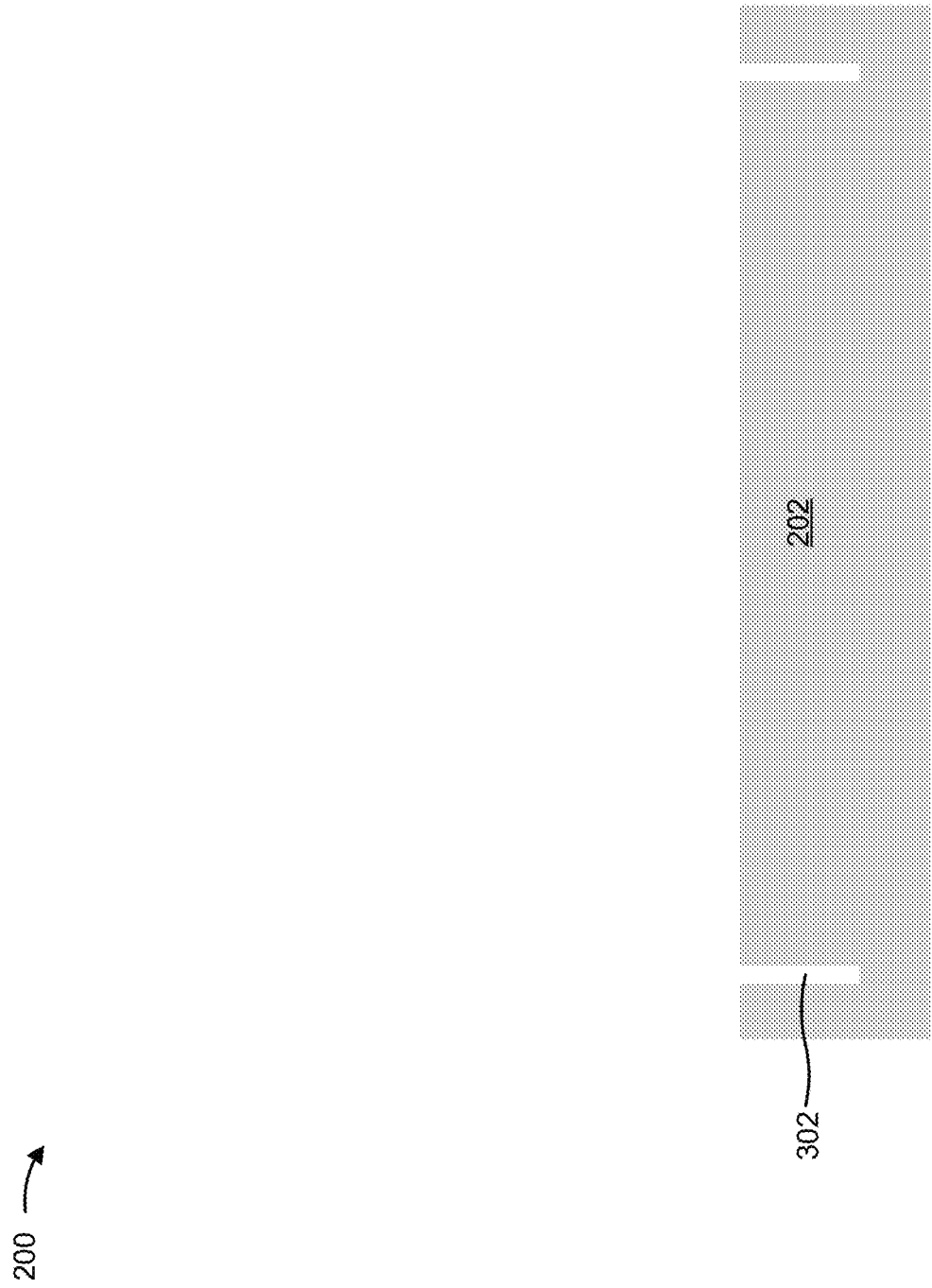
Figure 3C:
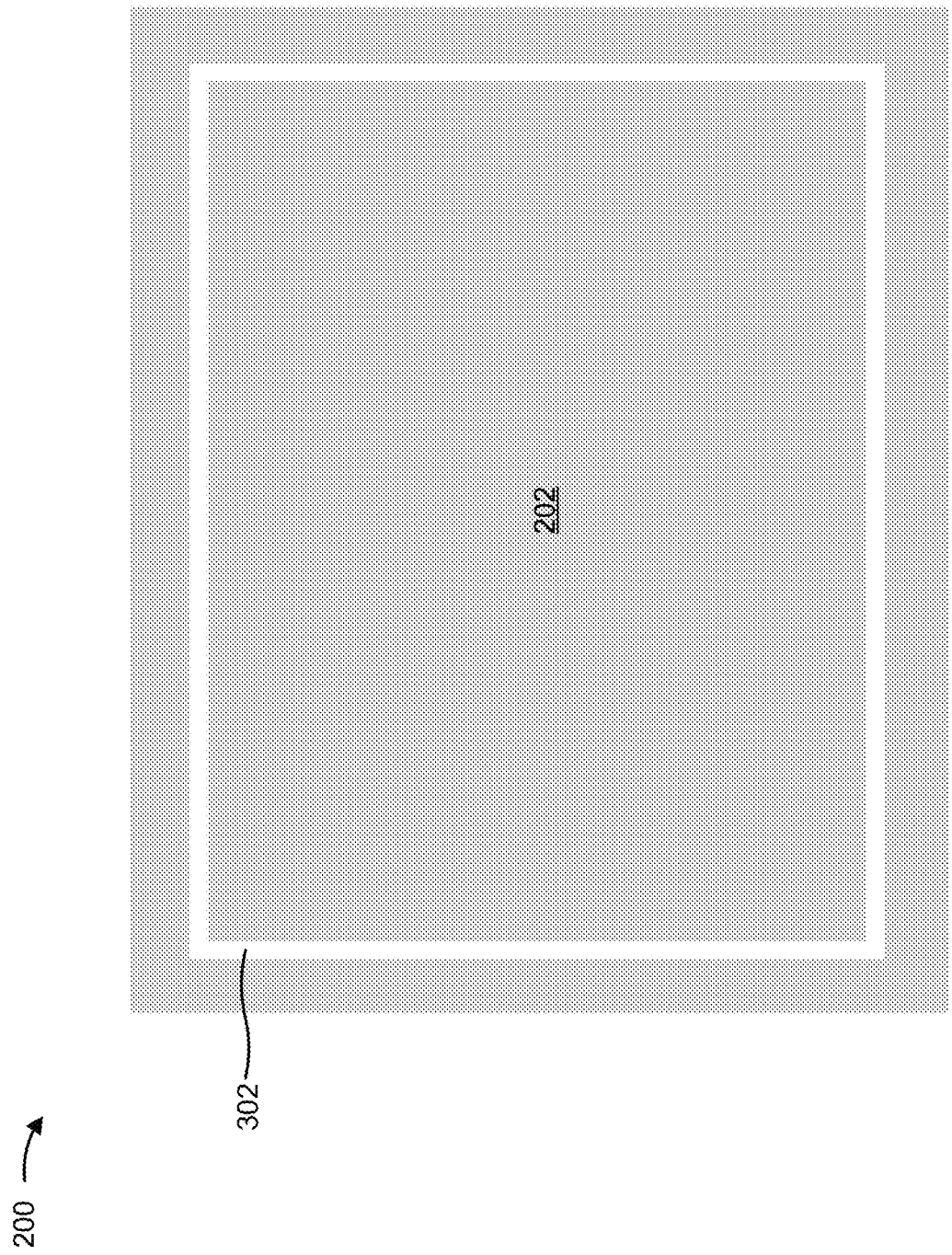
Figure 3D:
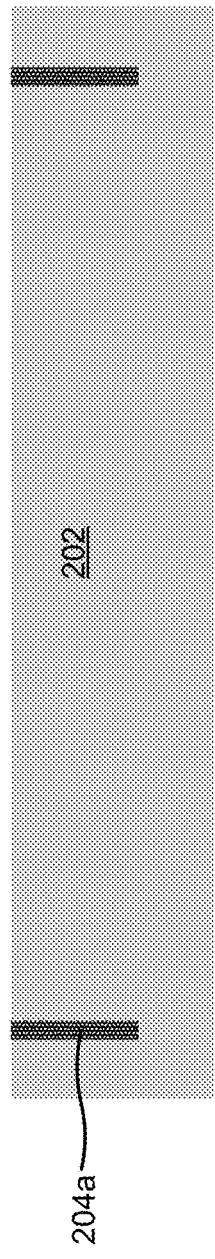
Figure 3E:
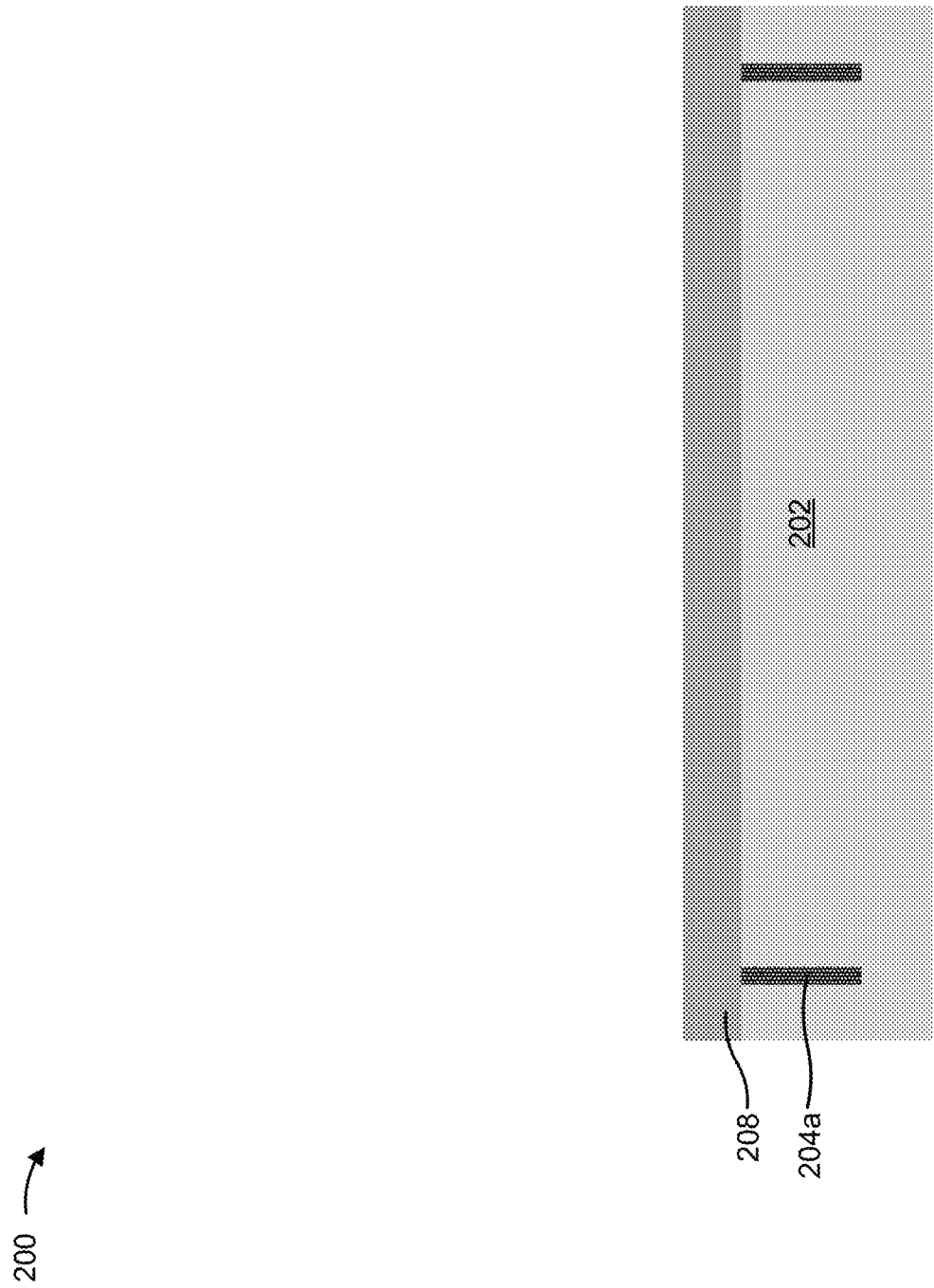
Figure 3F:
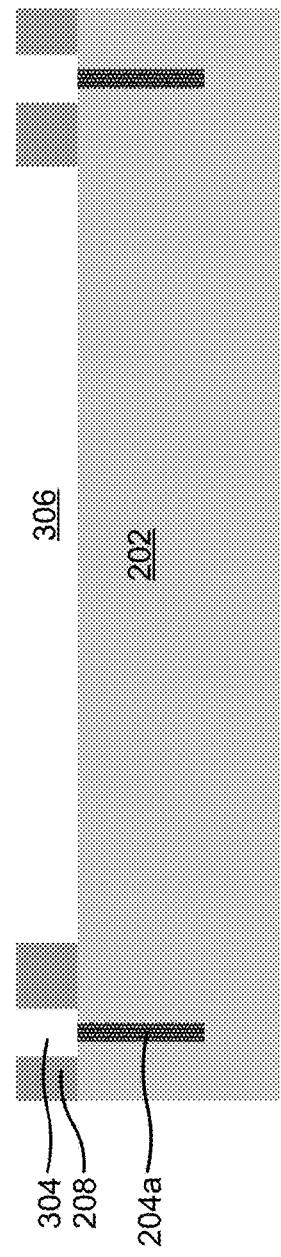
Figure 3G:
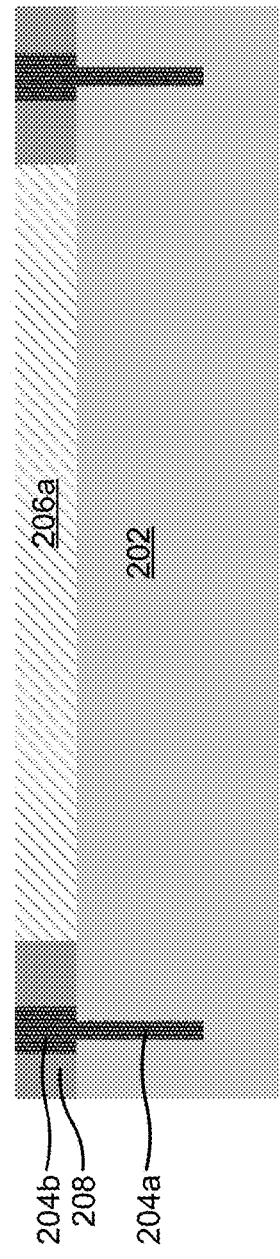
Figure 3H:
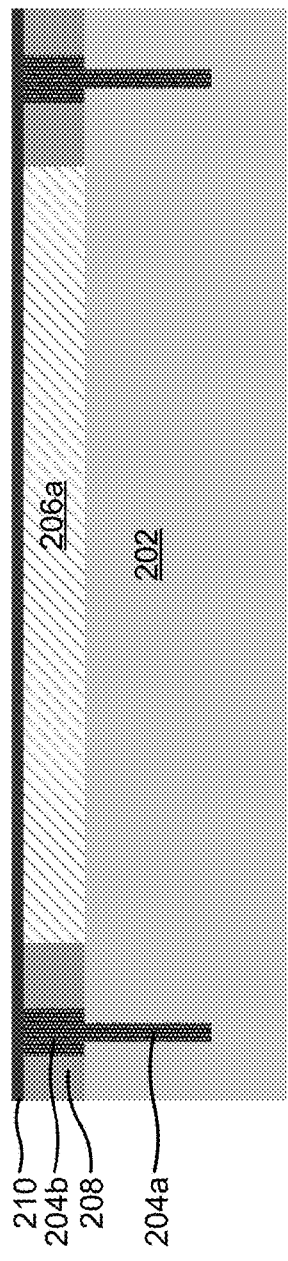
Figure 3I:
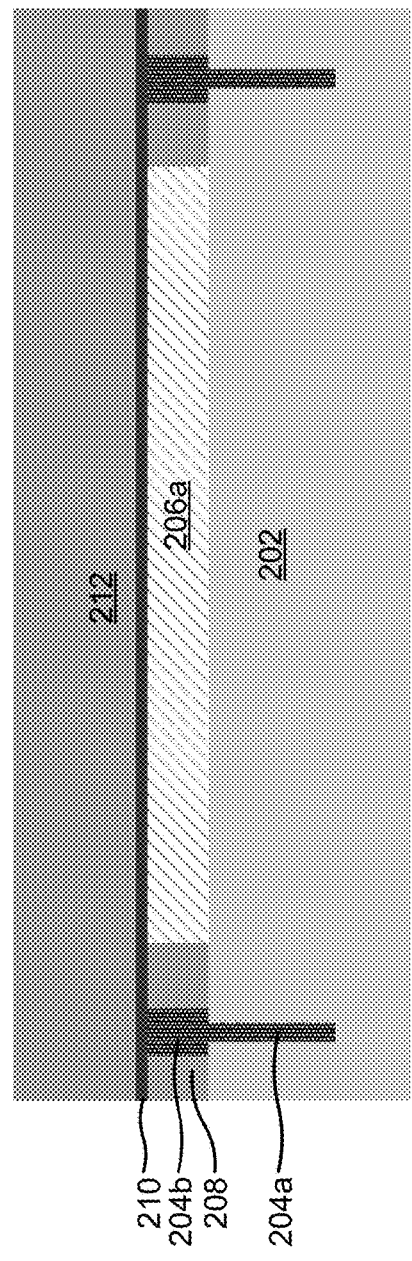
Figure 3J:
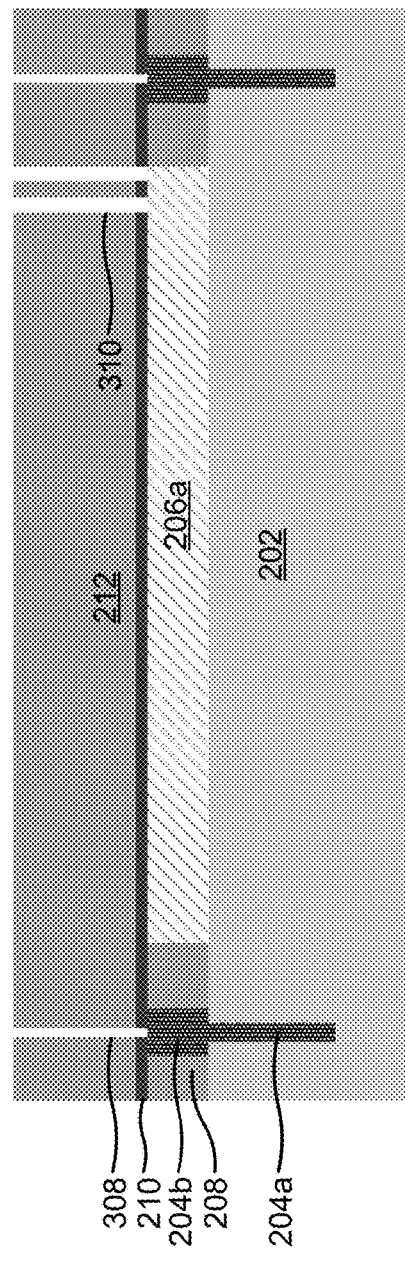
Figure 3K:
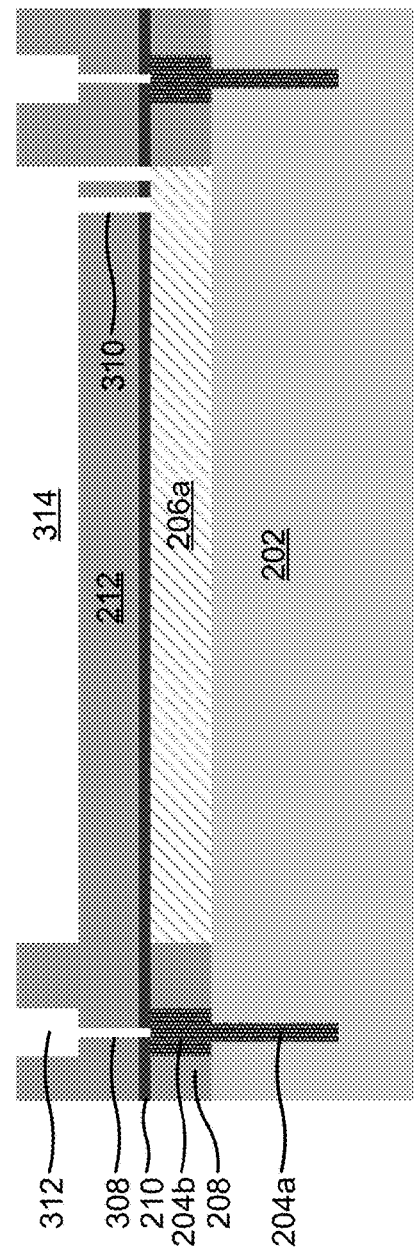
Figure 3L:
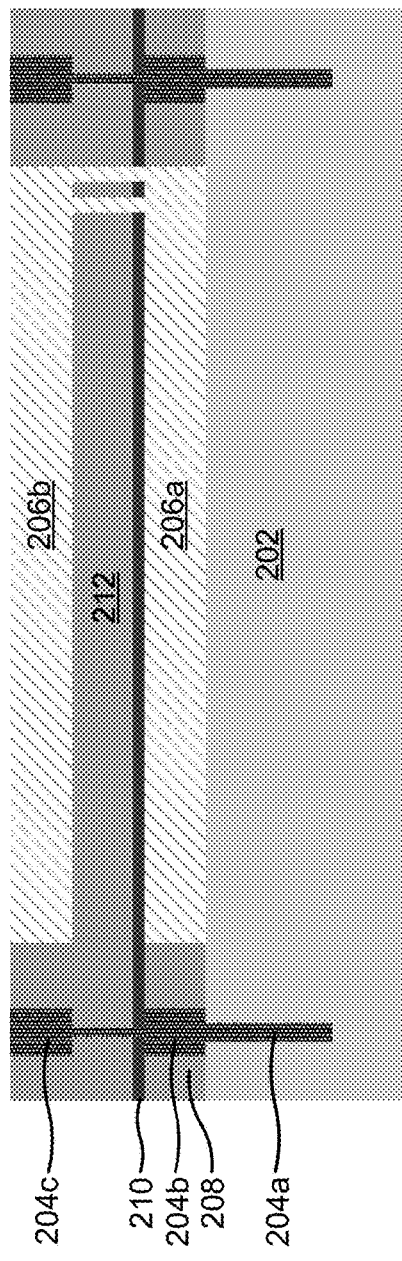
Figure 3M:
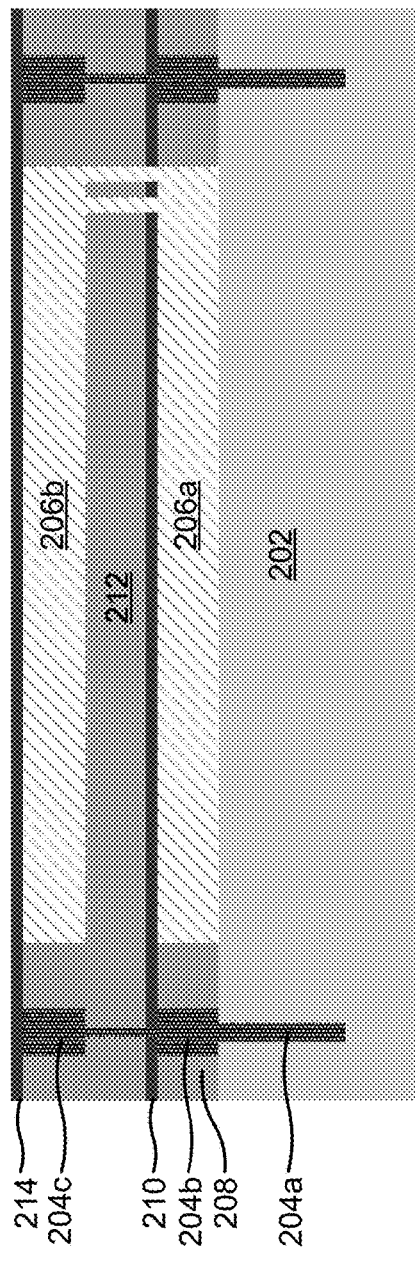
Figure 3N:
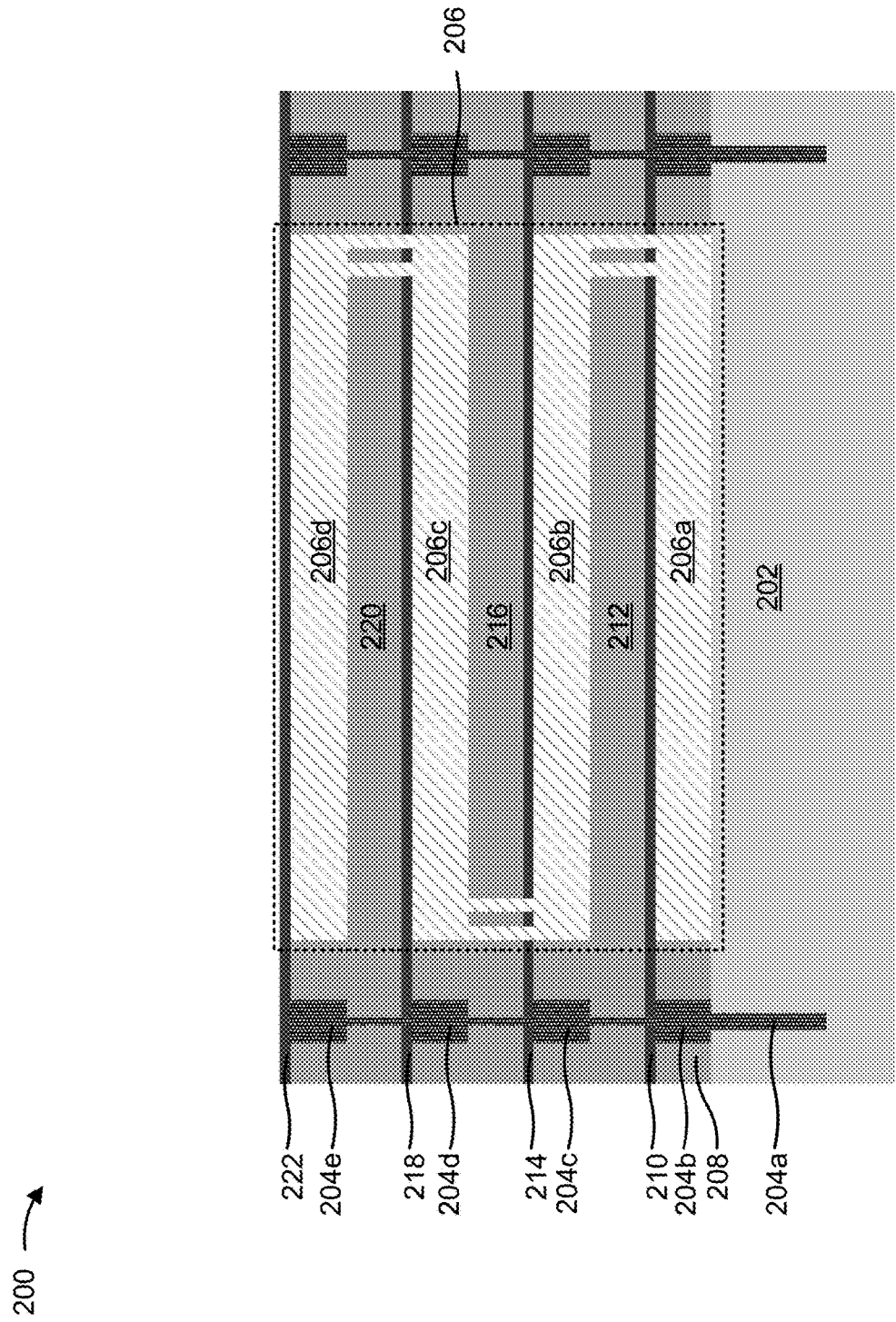
Figure 3O:
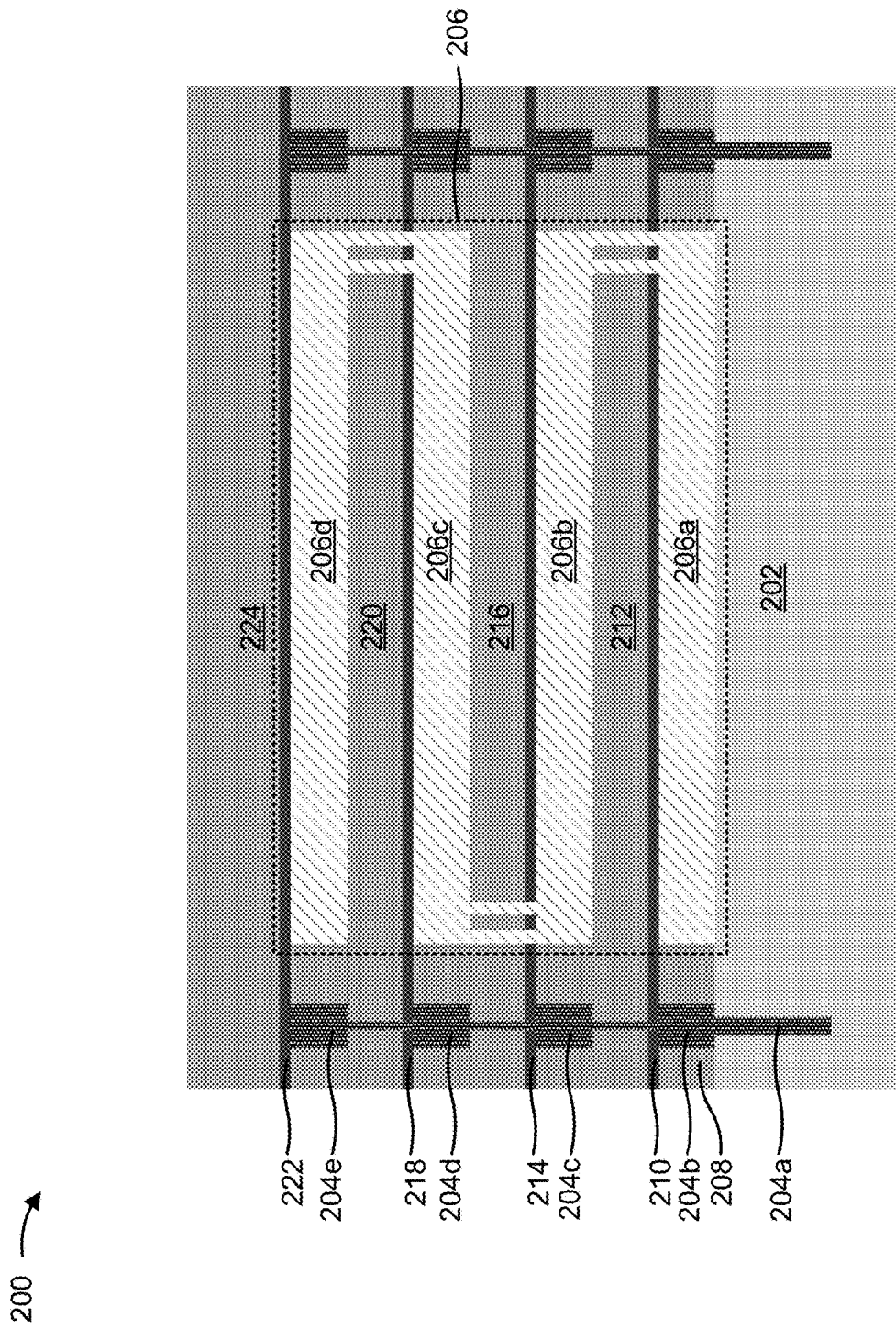
Figure 3P:
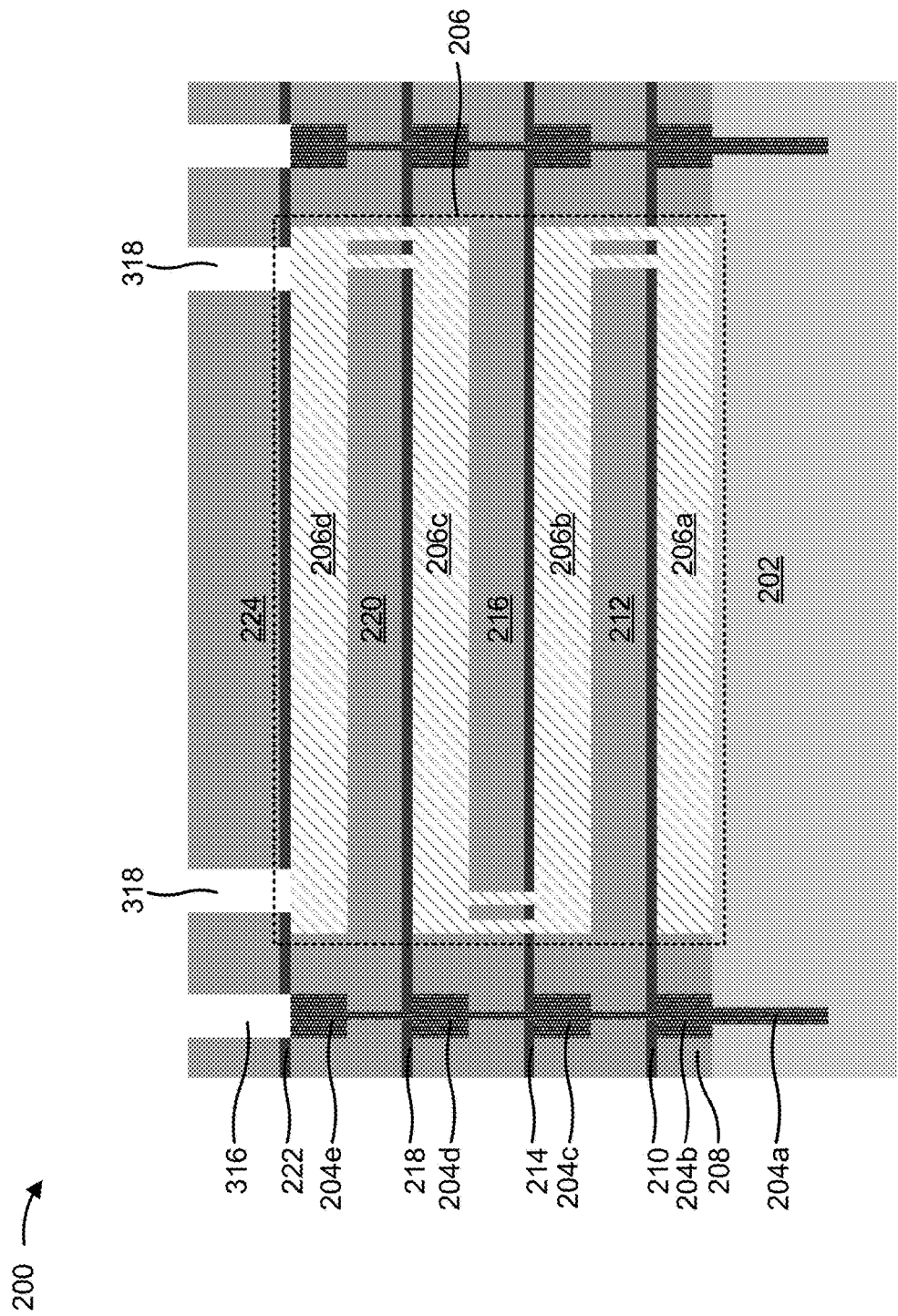
Figure 3Q:
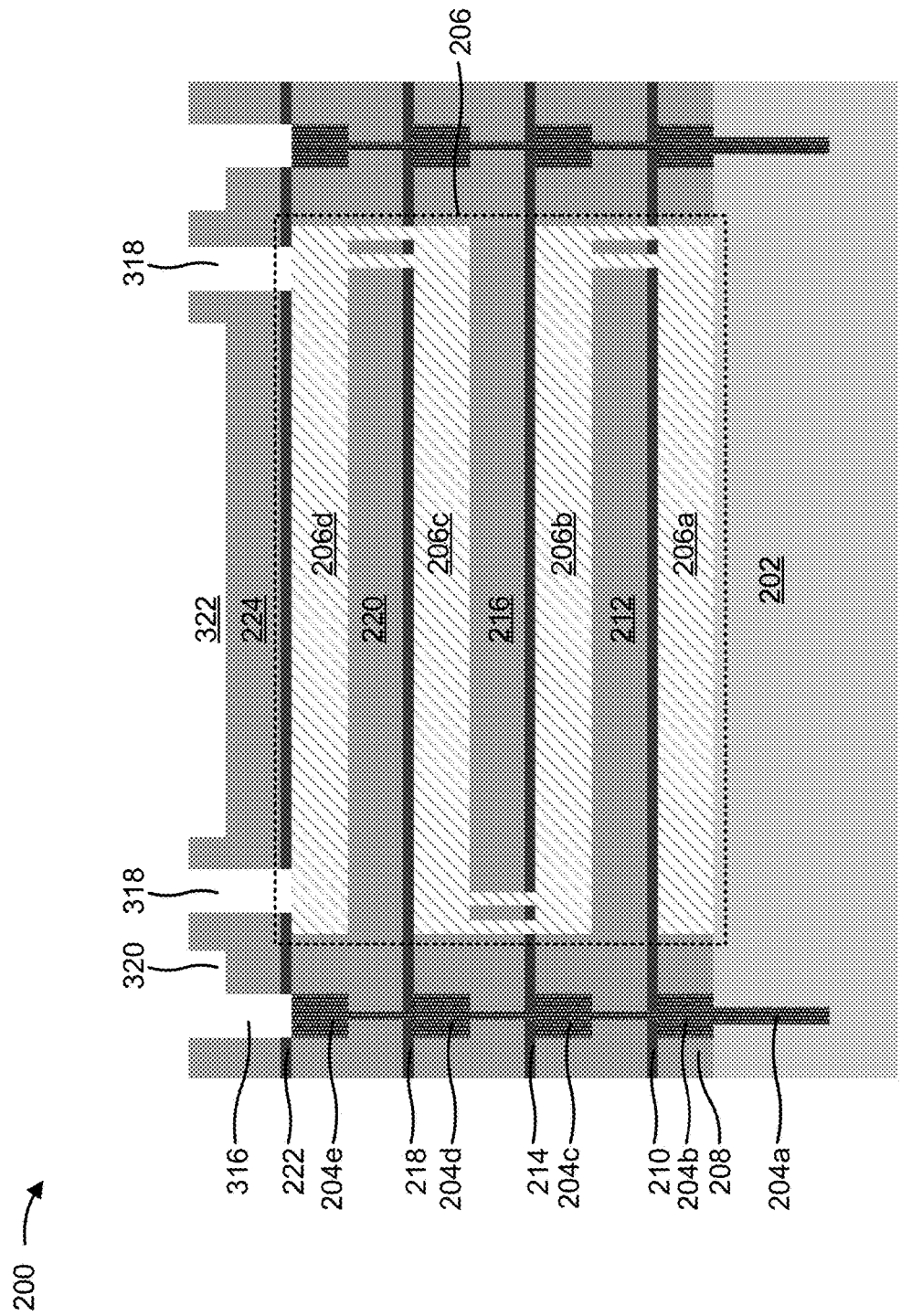
Figure 3R:
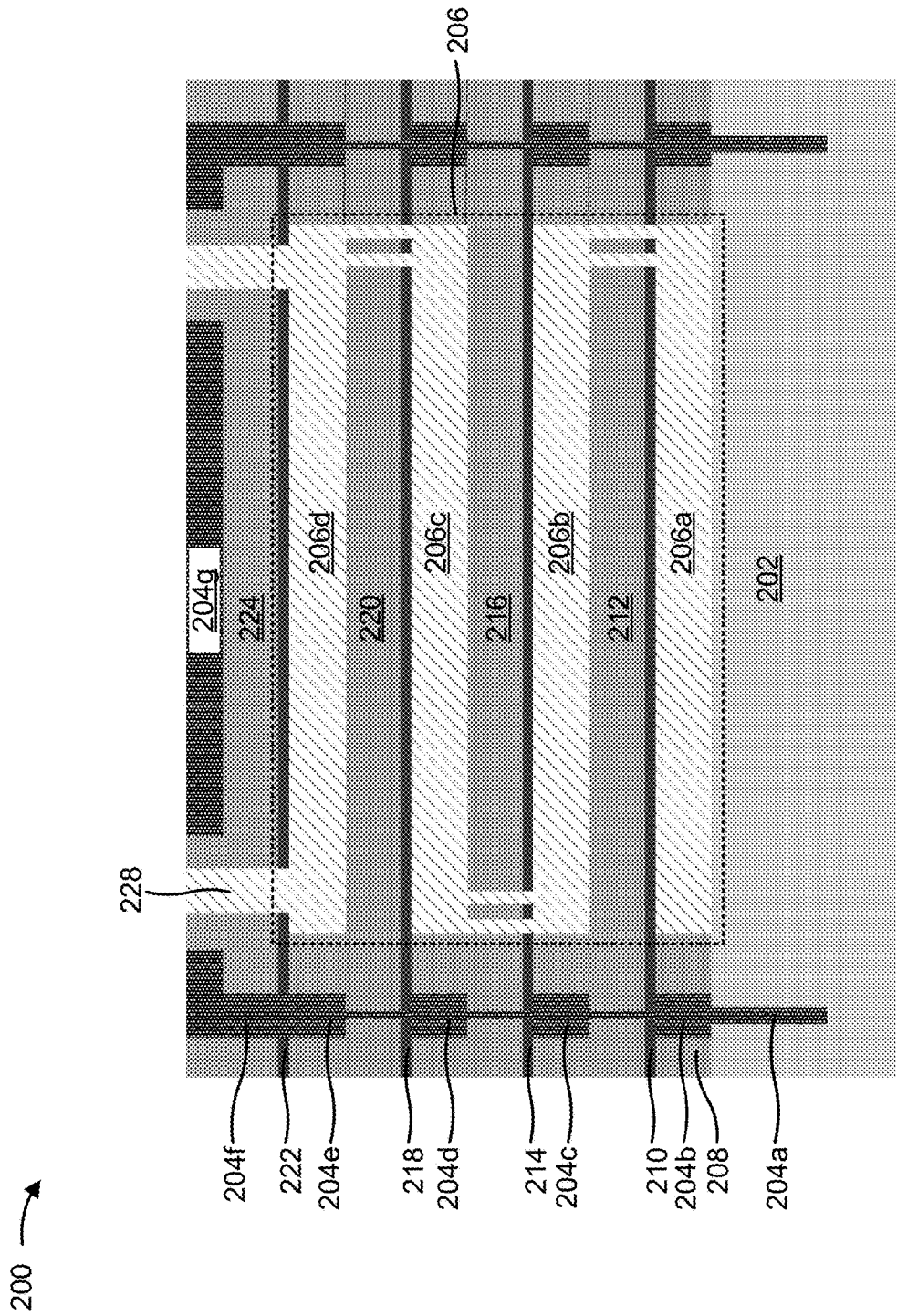
Figure 3S:
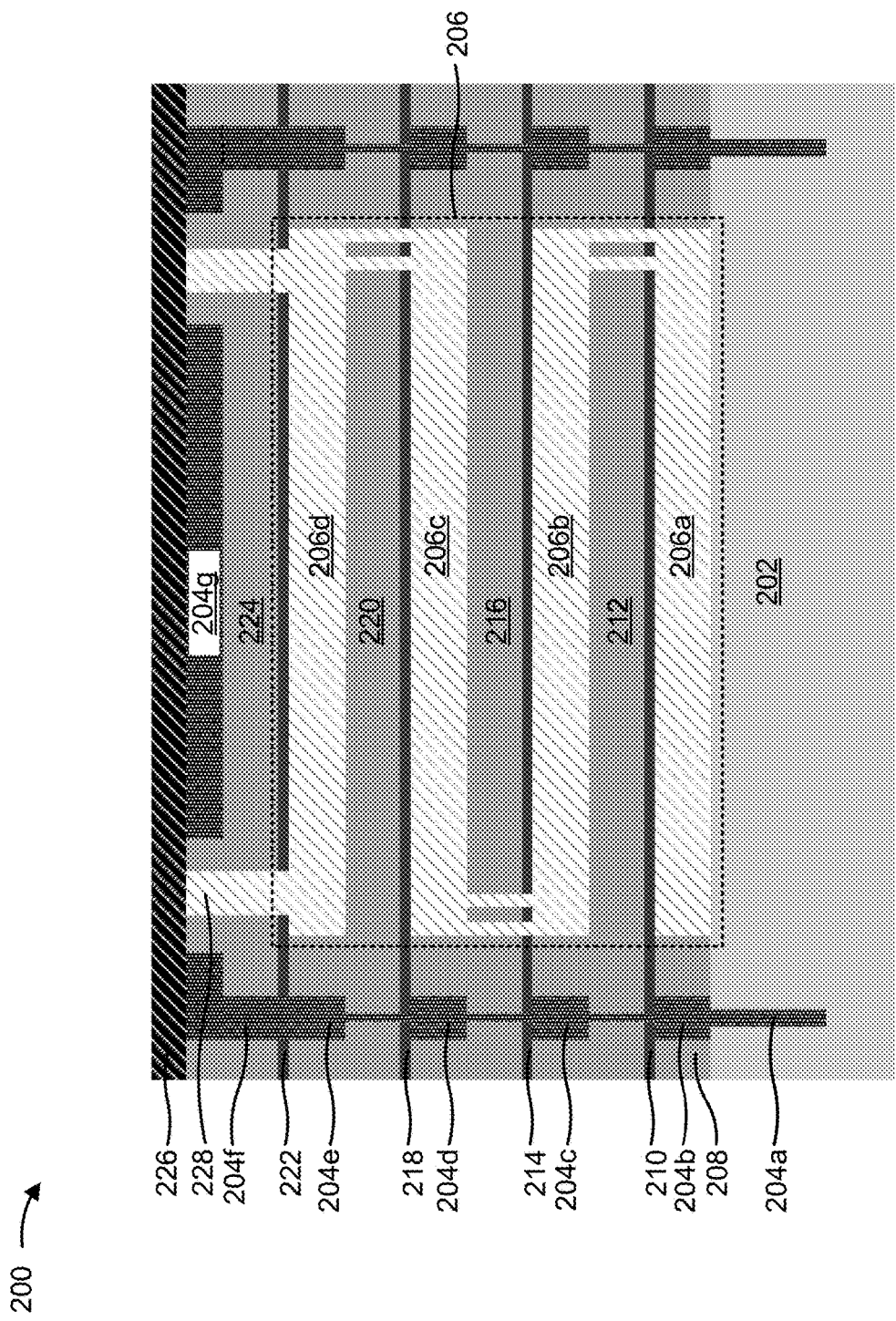
Figure 3T:
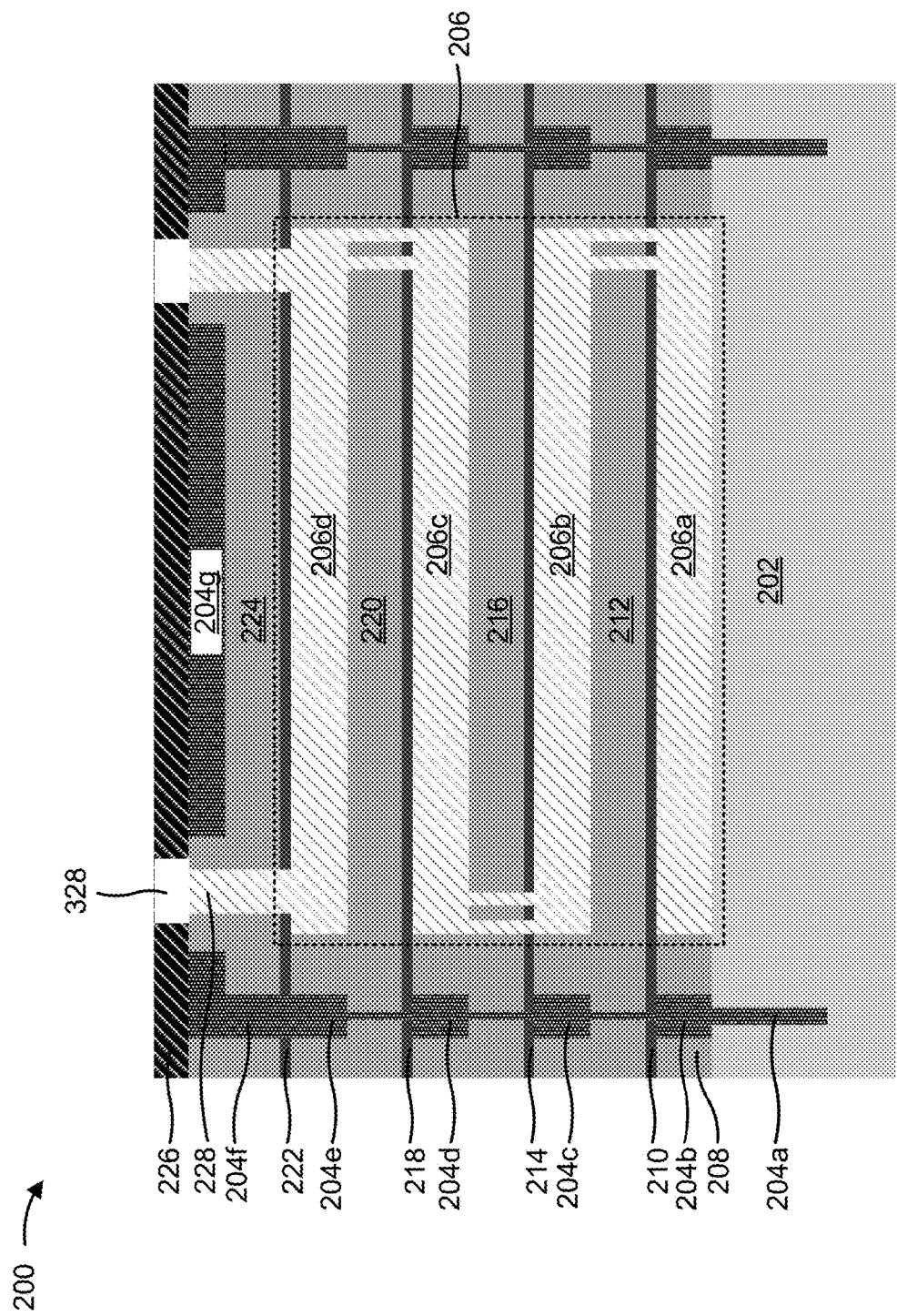
Figure 3U:
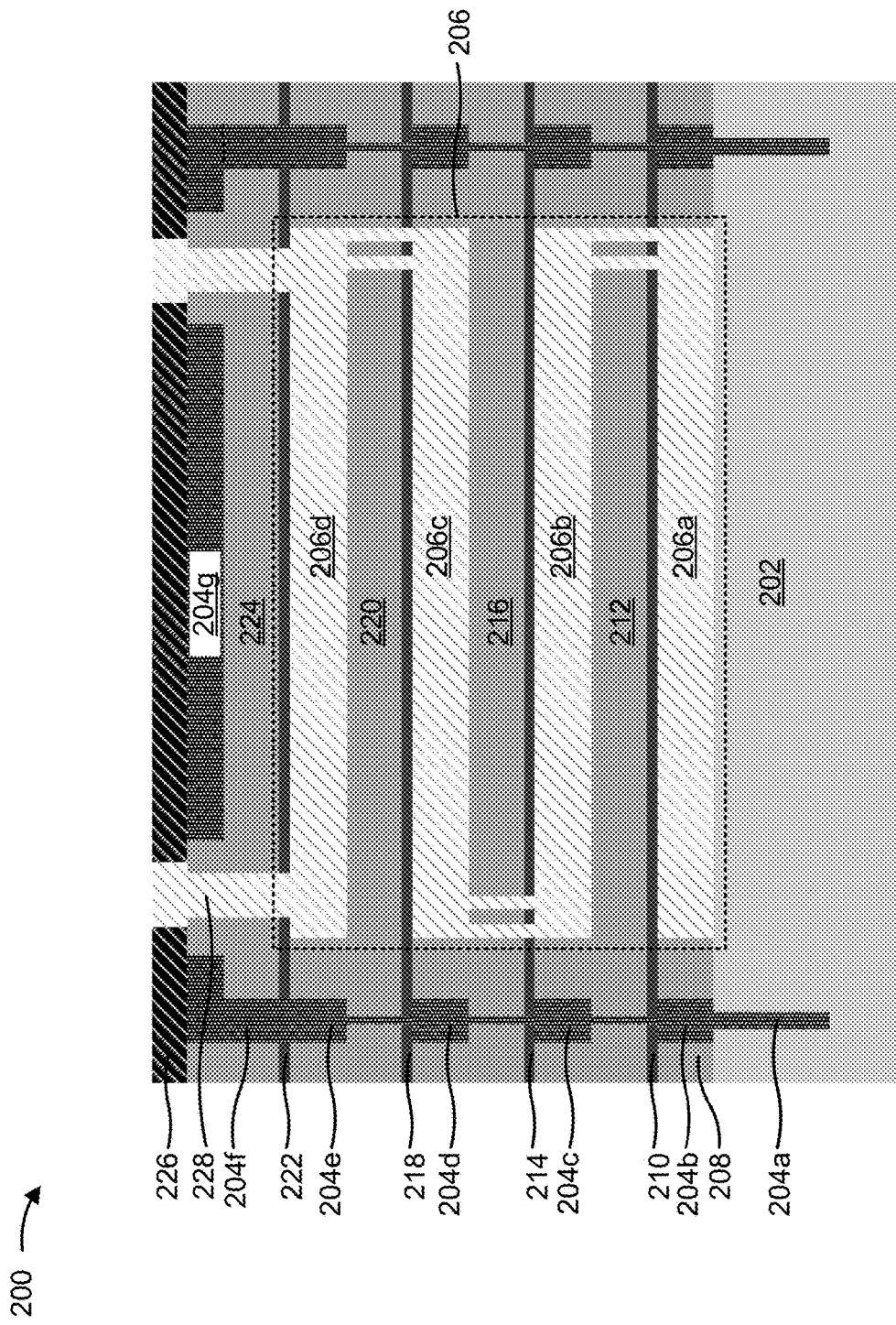

FIGS. 3A-3U are diagrams of an example implementation associated with forming the semiconductor device 200. As shown in FIG. 3A, the substrate 202 on which the semiconductor device 200 is to be formed may be provided.

As shown in FIG. 3B, one or more recesses 302 may be etched in the substrate 202. In some implementations, as shown, the recesses 302 may extend partially through the substrate 202. In some implementations, to form the recesses 302, the deposition tool 102 may deposit a photoresist layer on the substrate 202. The exposure tool 104 may form a pattern in the photoresist layer by exposing the photoresist layer to a radiation source, such as a UV source (e.g., a deep UV light source, an extreme UV (EUV) light source, and/or the like), an x-ray source, or an electron beam (e-beam) source, to transfer the pattern from a photomask to the photoresist layer. The developer tool 106 may perform a development operation that includes one or more techniques to develop the pattern in the photoresist layer. The etch tool 108 may etch the substrate 202 based on the pattern formed in the photoresist layer to form the recesses 302. For example, the etch tool 108 may perform a dry etching technique (e.g., where a plasma is used to sputter material, such as using a reactive ion etching (RIE) process), a wet etching technique (e.g., where the substrate 202 is exposed or submerged in a chemical that etches or removes material at a particular etch rate), or another type of etching technique. The remaining portions of the photoresist layer may be removed after the substrate 202 is etched to form the recesses 302.

FIG. 3C is provided for the purpose of illustrating an example top view of the substrate 202 after the one or more recesses 302 are etched in the substrate 202. The one or more recesses 302 shown in FIG. 3C define a pattern and shape for the shielding structure 204. In some implementations, other recesses associated with forming the shielding structure 204 (e.g., as described below with respect to formation of the semiconductor device 200) can be etched in a similar manner (e.g., such the shielding structure 204 has a rectangular shape from a top view perspective).

As shown in FIG. 3D, a shielding structure layer 204a may be formed in the one or more recesses 302. For example, the deposition tool 102 may first deposit a barrier layer (not shown) by sputtering a barrier layer material (e.g., tantalum nitride (TaN) or Ta, among other examples) in the one or more recesses 302 and on an exposed surface of the substrate 202. In some implementations, the barrier layer serves to prevent a material used to form shielding structure 204 (e.g., electroplated copper (Cu)) from diffusing into lower layers of the semiconductor device 200. Next, the deposition tool 102 may deposit a seed layer (not shown) by sputtering a seed layer material on the barrier layer. In some implementations, the seed layer helps growth of the shielding structure 204 material to be used to fill the one or more recesses 302 and form the shielding structure layer 204a. Next, the plating tool 116 may perform an electro plating process (e.g., an electrochemical plating (ECP) process) to fill the one or more recesses 302 with the shielding structure 204 material (e.g., electroplated Cu). After the plating is performed, the planarization tool 110 performs a polishing process (e.g., a CMP process) to remove excess material, thereby forming the shielding structure layer 204a in the one or more recesses 302.

As shown in FIG. 3E, the dielectric layer 208 may be formed. For example, the deposition tool 102 may deposit the dielectric layer 208 on the shielding structure layer 204a and the substrate 202 using a CVD process, a PVD process, an ALD process, or another type of deposition process.

As shown in FIG. 3F, one or more recesses 304 and a recess 306 may be formed in the dielectric layer 208. As described below, the one or more recesses 304 are recesses in which a shielding structure layer 204b is to be formed, while the recess 306 is a recess in which an inductance structure layer 206a is to be formed. In some implementations, as shown, the one or more recesses 304 and the recess 306 may extend through the dielectric layer 208 to the shielding structure layer 204a and the substrate 202. In some implementations, to form the one or more recesses 304 and the recess 306, the deposition tool 102 may deposit a photoresist layer on the dielectric layer 208. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the dielectric layer 208 based on the pattern formed in the photoresist layer to form the one or more recesses 304 and the recess 306. For example, the etch tool 108 may perform a wet etching technique, a dry etching technique, or another type of etching technique. The remaining portions of the photoresist layer may be removed after the dielectric layer 208 is etched to form the one or more recesses 304 and the recess 306.

As shown in FIG. 3G, the shielding structure layer 204b and the inductance structure layer 206a may be formed in the one or more recesses 304 and the recess 306, respectively. For example, the deposition tool 102 may first deposit a barrier layer (not shown) by sputtering a barrier layer material in the one or more recesses 304, the recess 306, and on an exposed surface of the dielectric layer 208. Next, the deposition tool 102 may deposit a seed layer (not shown) by sputtering a seed layer material on the barrier layer. Next, the plating tool 116 may perform an electro plating process (e.g., an ECP process) to fill the one or more recesses 304 and the recess 306 with the plating material (e.g., electroplated Cu). After the plating is performed, the planarization tool 110 performs a polishing process (e.g., a CMP process) to remove excess plating material, thereby forming the shielding structure layer 204b in the one or more recesses 304 and forming the inductance structure layer 206a in the recess 306. Notably, in the semiconductor device 200, the shielding structure 204 and the inductance structure 206 are formed from the same material (e.g., electroplated copper), however, in some implementations, the shielding structure 204 and the inductance structure 206 may be formed from different materials (e.g., different metals). In such a case, the process 300 can be modified so that a given shielding structure layer 204 and a given inductance structure layer 206 are formed at different process steps.

As shown in FIG. 3H, the etch stop layer 210 is formed over the shielding structure layer 204b, the inductance structure layer 206a, and portions of the dielectric layer 208. For example, the deposition tool 102 may deposit the etch stop layer 210 on the shielding structure layer 204b, the inductance structure layer 206a, and exposed surfaces of the dielectric layer 208 using a CVD process, a PVD process, an ALD process, or another type of deposition process.

As shown in FIG. 3I, the dielectric layer 212 may be formed. For example, the deposition tool 102 may deposit the dielectric layer 212 on the etch stop layer 210 using a CVD process, a PVD process, an ALD process, or another type of deposition process.

As shown in FIG. 3J, one or more recesses 308 and one or more recesses 310 may be formed in the dielectric layer 212. As described below, the one or more recesses 308 are recesses in which a portion of shielding structure layer 204c is to be formed, while the one or more recesses 310 are recesses in which a portion of an inductance structure layer 206b is to be formed. In some implementations, as shown, the one or more recesses 308 and the one or more recesses 310 may extend through the dielectric layer 212 and the etch stop layer 210 to the shielding structure layer 204b and the inductance structure layer 206a, respectively. In some implementations, to form the one or more recesses 308 and the one or more recesses 310, the deposition tool 102 may deposit a photoresist layer on the dielectric layer 212. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the dielectric layer 212 based on the pattern formed in the photoresist layer to form the one or more recesses 308 and the one or more recesses 310. For example, the etch tool 108 may perform a dry etching technique (e.g., using an RIE process), a wet etching technique, or another type of etching technique. The remaining portions of the photoresist layer may be removed after the dielectric layer 212 is etched to form the one or more recesses 308 and the one or more recesses 310. In some implementations, the etch stop layer 210 may protects one or more lower layers of the semiconductor device 200 or indicates an etch endpoint associated with formation of the one or more recesses 308 and the one or more recesses 310.

As shown in FIG. 3K, one or more recesses 312 and a recess 314 may be formed in the dielectric layer 212. As described below, the one or more recesses 312 are recesses in which a portion of shielding structure layer 204c is to be formed, while the recess 314 is a recess in which a portion of an inductance structure layer 206b is to be formed. In some implementations, as shown, the one or more recesses 312 may be formed over the one or more recesses 308, while the recess 314 may be formed over the one or more recesses 310. In some implementations, the one or more recesses 312 and the recess 314 extend through a portion of the dielectric layer 212. In some implementations, to form the one or more recesses 312 and the recess 314, the deposition tool 102 may deposit a photoresist layer on the dielectric layer 212. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the dielectric layer 212 based on the pattern formed in the photoresist layer to form the one or more recesses 312 and the recess 314. For example, the etch tool 108 may perform a dry etching technique (e.g., using an RIE process), a wet etching technique, or another type of etching technique. The remaining portions of the photoresist layer may be removed after the dielectric layer 212 is etched to form the one or more recesses 312 and the recess 314.

As shown in FIG. 3L, the shielding structure layer 204c may be formed in the one or more recesses 308 and the one or more recesses 312, and the inductance structure layer 206b may be formed in the one or more recesses 310 and the recess 314. For example, the deposition tool 102 may first deposit a barrier layer (not shown) by sputtering a barrier layer material in the one or more recesses 308, the one or more recesses 310, the one or more recesses 312, and the recess 312, and on an exposed surface of the dielectric layer 212. Next, the deposition tool 102 may deposit a seed layer (not shown) by sputtering a seed layer material on the barrier layer. Next, the plating tool 116 may perform an electro plating process (e.g., an ECP process) to fill the one or more recesses 308, the one or more recesses 310, the one or more recesses 312, and the recess 314 with plating material. After the plating is performed, the planarization tool 110 performs a polishing process (e.g., a CMP process) to remove excess plating material, thereby forming the shielding structure layer 204c in the one or more recesses 308 and the one or more recesses 312 and forming the inductance structure layer 206b in the one or more recesses 310 and the recess 314.

As shown in FIG. 3M, the etch stop layer 214 is formed over the shielding structure layer 204c, the inductance structure layer 206b, and portions of the dielectric layer 212. For example, the deposition tool 102 may deposit the etch stop layer 214 on the shielding structure layer 204c, the inductance structure layer 206b, and exposed surfaces of the dielectric layer 212 using a CVD process, a PVD process, an ALD process, or another type of deposition process.

As shown in FIG. 3N, the operations of FIGS. 3I-3M can be repeated one or more times to form additional shielding structure layers (e.g., shielding structure layer 204d and shielding structure layer 204e), additional inductance structure layers (e.g., inductance structure layer 206c and inductance structure layer 206d), additional dielectric layers (e.g., dielectric layer 216 and dielectric layer 220), and additional etch stop layers (e.g., etch stop layer 218 and etch stop layer 222) in a similar manner. As shown in FIG. 3N, the inductance structure layers 206a-206d form the inductance structure 206.

As shown in FIG. 3O, the dielectric layer 224 may be formed. For example, the deposition tool 102 may deposit the dielectric layer 224 on the etch stop layer 222 using a CVD process, a PVD process, an ALD process, or another type of deposition process.

As shown in FIG. 3P, one or more recesses 316 and recesses 318 may be formed in the dielectric layer 224. As described below, the one or more recesses 316 are recesses in which a portion of shielding structure layer 204f is to be formed, while the recesses 318 are recesses in which portions of the connective structures 228 are to be formed. In some implementations, as shown, the one or more recesses 316 and the recesses 318 may extend through the dielectric layer 224 and the etch stop layer 222 to the shielding structure layer 204e and the inductance structure layer 206d, respectively. In some implementations, to form the one or more recesses 316 and the recesses 318, the deposition tool 102 may deposit a photoresist layer on the dielectric layer 224. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the dielectric layer 224 based on the pattern formed in the photoresist layer to form the one or more recesses 316 and the recesses 318. For example, the etch tool 108 may perform a dry etching technique (e.g., using an RIE process), a wet etching technique, or another type of etching technique. The remaining portions of the photoresist layer may be removed after the dielectric layer 224 is etched to form the one or more recesses 316 and the recesses 318.

As shown in FIG. 3Q, one or more recesses 320 and a recess 322 may be formed in the dielectric layer 224. As described below, the one or more recesses 320 are recesses in which a portion of shielding structure layer 204f is to be formed, while the recess 322 is a recess in which a shielding structure layer 204g is to be formed. In some implementations, as shown, the one or more recesses 320 may be formed adjacent to the one or more recesses 316, while the recess 322 may be formed adjacent to the recesses 318. In some implementations, the one or more recesses 320 and the recess 322 extend through a portion of the dielectric layer 224. In some implementations, to form the one or more recesses 320 and the recess 322, the deposition tool 102 may deposit a photoresist layer on the dielectric layer 224. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the dielectric layer 224 based on the pattern formed in the photoresist layer to form the one or more recesses 320 and the recess 322. For example, the etch tool 108 may perform a dry etching technique (e.g., using an RIE process), a wet etching technique, or another type of etching technique. The remaining portions of the photoresist layer may be removed after the dielectric layer 224 is etched to form the one or more recesses 320 and the recess 322.

As shown in FIG. 3R, the shielding structure layer 204f may be formed in the one or more recesses 316 and the one or more recesses 320, the portions of the connective structures 228 may be formed in the recesses 318, and the shielding structure layer 204g be formed in the recess 322. For example, the deposition tool 102 may first deposit a barrier layer (not shown) by sputtering a barrier layer material in the one or more recesses 316, the recesses 318, the one or more recesses 320, and the recess 322, and on an exposed surface of the dielectric layer 224. Next, the deposition tool 102 may deposit a seed layer (not shown) by sputtering a seed layer material on the barrier layer. Next, the plating tool 116 may perform an electro plating process (e.g., an ECP process) to fill the one or more recesses 316, the recesses 318, the one or more recesses 320, and the recess 322 with plating material. After the plating is performed, the planarization tool 110 performs a polishing process (e.g., a CMP process) to remove excess plating material, thereby forming the shielding structure layer 204f in the one or more recesses 316 and the one or more recesses 320, forming the portions of the connective structures 228 in the recesses 318, and forming the shielding structure layer 204g in the recess 322.

As shown in FIG. 3S, the passivation layer 226 may be formed. For example, the deposition tool 102 may deposit the passivation layer 226 on the shielding structure layer 204f, the shielding structure layer 204g, the portions of the connective structures 228, and exposed portions of the dielectric layer 224 using a CVD process, a PVD process, an ALD process, or another type of deposition process.

As shown in FIG. 3T, recesses 328 may be formed in the passivation layer 226. As described below, the recesses 328 are recesses in which portions of the connective structures 228 are to be formed. In some implementations, the recesses 328 through a portion of the passivation layer 226 to the portions of the connective structures 228 are formed in the manner described above. In some implementations, to form the recesses 328, the deposition tool 102 may deposit a photoresist layer on the passivation layer 226. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the passivation layer 226 based on the pattern formed in the photoresist layer to form the recesses 328. For example, the etch tool 108 may perform a dry etching technique (e.g., using an RIE process), a wet etching technique, or another type of etching technique. The remaining portions of the photoresist layer may be removed after the passivation layer 226 is etched to form the recesses 328.

As shown in FIG. 3U, the portions of the connective structures 228 may be formed in the recesses 328. For example, the deposition tool 102 may first deposit a barrier layer (not shown) by sputtering a barrier layer material in the recesses 328 and on an exposed surface of the passivation layer 226. Next, the deposition tool 102 may deposit a seed layer (not shown) by sputtering a seed layer material on the barrier layer. Next, the plating tool 116 may perform an electro plating process (e.g., an ECP process) to fill the recesses 328 with plating material. After the plating is performed, the planarization tool 110 performs a polishing process (e.g., a CMP process) to remove excess plating material, thereby forming the portions of the connective structures 228 in the recesses 328.

In this way, the semiconductor device 200 including the shielding structure 204 around the inductance structure 206 can be formed. Notably, the shielding structure 204 shown in the semiconductor device 200 includes a vertical shielding structure portion (e.g., formed by the shielding structure layers 204a through 204f) that is around the perimeter of the inductance structure 206. Further, the shielding structure 204 shown in the semiconductor device 200 includes a horizontal shielding structure portion (e.g., formed by the shielding structure layer 204g) that is above a surface of the inductance structure 206 (e.g., a top surface according to the orientation of the semiconductor device in FIG. 2B). In some implementations, the shielding structure 204 may include another horizontal shielding structure portion, as described in further detail below.

In some implementations, after formation of the semiconductor device 200 as described above, a dicing process may be performed to cut the semiconductor device from a wafer. For example, plasma dicing may be performed using the deposition tool 102, the exposure tool 104, the developer tool 106, and the etch tool 108 to perform an etch in a manner similar to that described above. In some implementations, a protective layer may be formed on the passivation layer 226 and the connective structures 228 to provide further protection for the semiconductor device 200 (e.g., during transport, handling, assembly, or the like). For example, the deposition tool 102 may deposit the protective layer on the passivation layer 226 and the connective structures 228.

As indicated above, FIGS. 3A-3U are provided as a series of example operations for forming the semiconductor device 200. In practice, a series of operations used to form the semiconductor device 200 may include additional operations, fewer operations, different operations, or differently ordered operations than those described with regard to FIGS. 3A-3U.

Figure 4:
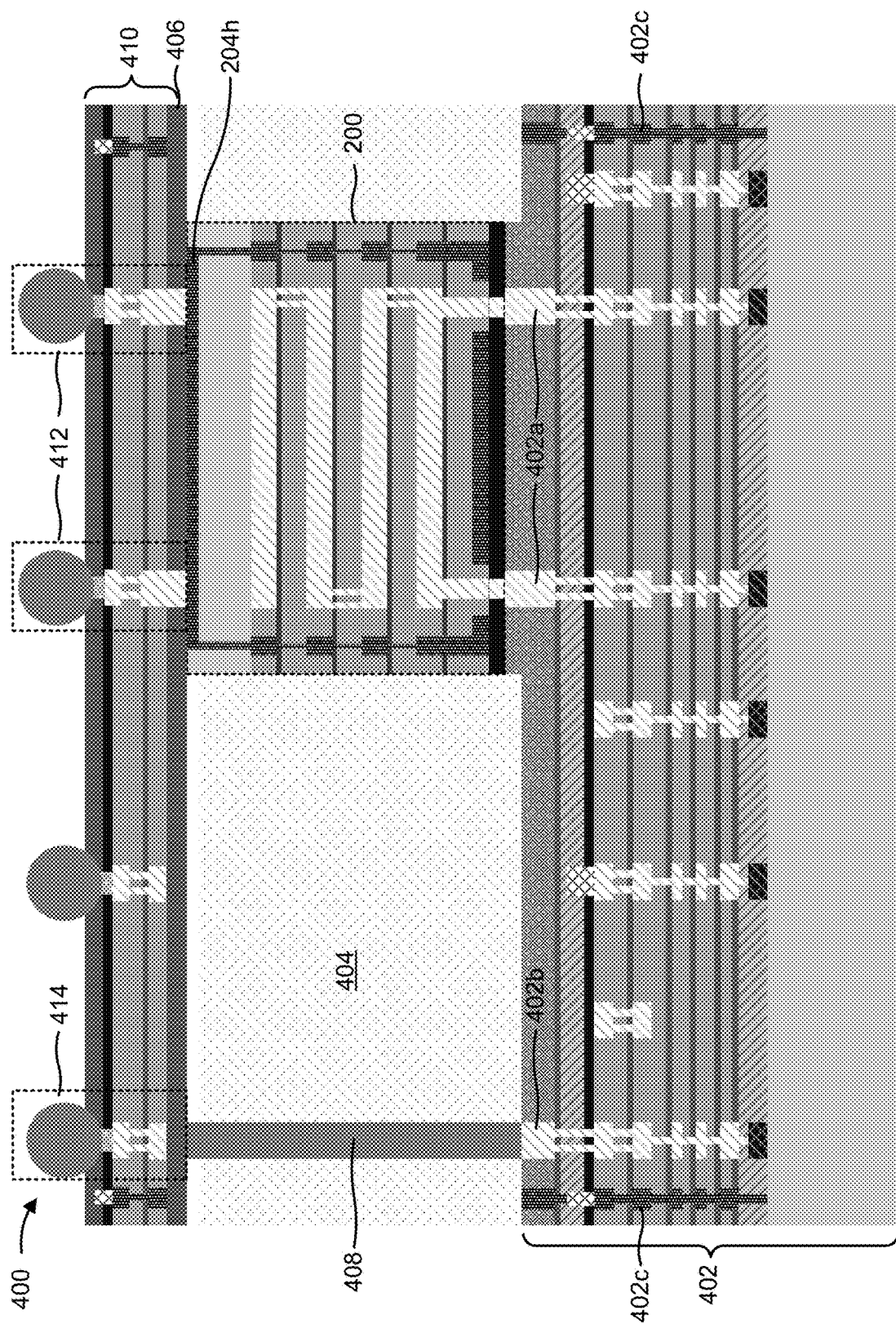
FIG. 4 is a diagram of an example semiconductor device described herein.

In some implementations, the semiconductor device 200 can be integrated with another semiconductor device (e.g., to enable the inductance structure 206 of the semiconductor device 200 to provide current noise reduction or current stabilization for a current flowing the other semiconductor device). FIG. 4 is a diagram of an example semiconductor device 400 in which the semiconductor device 200 is integrated with a semiconductor device 402. As shown in FIG. 4, the semiconductor device 400 includes the semiconductor device 200, the semiconductor device 402, a dielectric material 404, a capping layer 406, a conductive structure 408, a passivation structure 410, a set of connective structures 412, and a connective structure 414.

The semiconductor device 402 is a semiconductor device including one or more integrated circuits to which the inductance structure 206 is to be connected (e.g., when the semiconductor device 200 is bonded to the semiconductor device 402). For example, the semiconductor device 402 may include connective structures 402a to which the inductance structure 206 is connected when the semiconductor device 200 is bonded to the semiconductor device 402 (e.g., to permit the inductance structure 206 of the semiconductor device 200 to provide current noise reduction or stabilization for a current flowing through the connective structures 402a of the semiconductor device 400). As further shown, the semiconductor device 402 may include a connective structure 402b that is connected (e.g., by the conductive structure 408) to the connective structure 414 of the semiconductor device 400 (e.g., to permit the semiconductor device 402 to be connected to external circuitry). As further shown, the semiconductor device 402 may include one or more metal structures 402c (e.g., formed from one or more metal layers in a manner similar to the shielding structure 204). In some implementations, the one or more metal structures 402c may be around other features of the semiconductor device 402 (e.g., at an outer edge of the one or more other features). In some implementations, the one or more metal structures 402c may be protect the other features of the semiconductor device 402 from external EM fields. Further, in some implementations, the one or more metal structures 402c may enhance shielding of the inductance structure 206 of the semiconductor device 200 from external EM fields. Notably, the features (e.g., layers, connective structures, or the like) of the semiconductor device 402 are shown for illustrative purposes, and particular details of the features of the semiconductor device 402 are therefore not shown or described with specificity.

The dielectric material 404 is a dielectric material that provides isolation for other components of the semiconductor device 400 and acts as a spacer between the higher layers and structures of the semiconductor device 400 (e.g., the capping layer 406, the passivation structure 410, or the like) and the semiconductor device 402 in regions where the semiconductor device 200 is not present. In some implementations, the dielectric material 404 is around the semiconductor device 200 such that the dielectric material 404 provides a planar surface within the semiconductor device 400 after the semiconductor device 200 is affixed to the semiconductor device 402. In some implementations, the planar surface provided by the dielectric material 404 enables formation of other features of the semiconductor device 400 above the semiconductor device 200 (e.g., the capping layer 406, the passivation structure 410, the set of connective structures 412, the connective structure 414, or the like). In some implementations, the dielectric material 404 may include, for example, $SiO_2$ or another type of dielectric material.

The capping layer 406 is a layer to protect one or more lower devices or layers (e.g., the semiconductor device 200, the dielectric material 404, or the like). In some implementations, the capping layer 406 may be formed from, for example, SiN or SiCN, among other examples.

The conductive structure 408 is a structure to enable the connective structure 402b of the semiconductor device 402 to be connected to the connective structure 414 (e.g., such that the semiconductor device 402 can be connected to external circuitry). In some implementations, the conductive structure is a through dielectric via (TDV). In some implementations, the conductive structure 408 may be formed from a conductive material, such as a metal (e.g., copper, aluminum, or silver, among other examples).

The passivation structure 410 is a structure to protect other (lower) layers or features of the semiconductor device 400 from damage. In some implementations, the passivation structure 410 may be formed after the semiconductor device 200 is affixed (e.g., bonded) to the semiconductor device 402 and after the conductive structure 408 is formed through the dielectric material 404. In some implementations, the passivation structure 410 may include one or more dielectric layers, such as one or more $SiO_2$ layers, one or more SiN bi-layers, or one or more other types of layers suitable for protecting other layers or features of the semiconductor device 400 from damage. Further, in some implementations, the passivation structure 410 may include one or more etch stop layers used in association with forming the set of connective structures 412 and the connective structure 414.

The set of connective structures 412 is a set of structures that provide an electrical connection to the shielding structure 204 (e.g., such that the shielding structure 204 can be connected to external circuity). In some implementations, as shown in FIG. 4, each connective structure 412 of the set of connective structures 412 includes one or more conductive layers (e.g., formed from a conductive material, such as copper, aluminum, or silver, among other examples) and a wafer bump.

The connective structure 414 is a structure that provides an electrical connection to the semiconductor device 402 (e.g., such that the semiconductor device 402 can be connected to external circuitry). In some implementations, as shown in FIG. 4, the connective structure 414 includes one or more conductive layers (e.g., formed from a conductive material, such as copper, aluminum, or silver, among other examples) and a wafer bump.

As indicated above, FIG. 4 is provided as an example. Other examples may differ from what is described with regard to FIG. 4.

FIGS. 5A-5J are diagrams of an example implementation 500 associated with forming the semiconductor device 400.

Figure 5A:
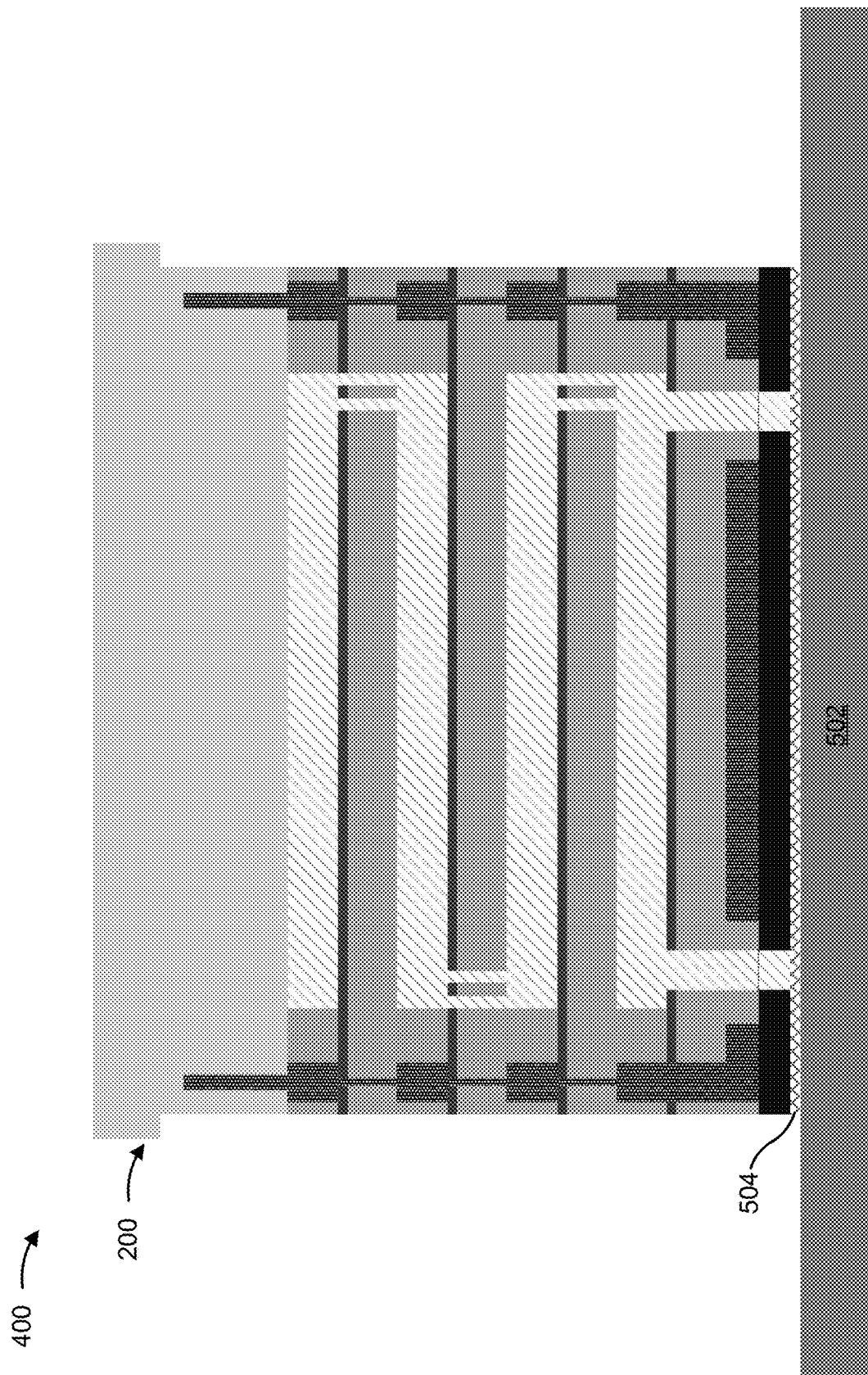
FIGS. 5A-5J are diagrams of an example implementation described herein.

As shown in FIG. 5A, the semiconductor device 200 may be affixed to a platform 502 using an adhesive 504 (e.g., a tape or a glue, among other examples). As shown, the semiconductor device 200 is oriented such that a top side of the semiconductor device 200 (e.g., the top side of the semiconductor device 200 as oriented in FIG. 2B) is affixed to the platform 502. That is, the semiconductor device 200 is flipped in a vertical direction from the orientation of the semiconductor device 200 shown in FIG. 2B, and is then affixed to the platform 502.

Figure 5B:
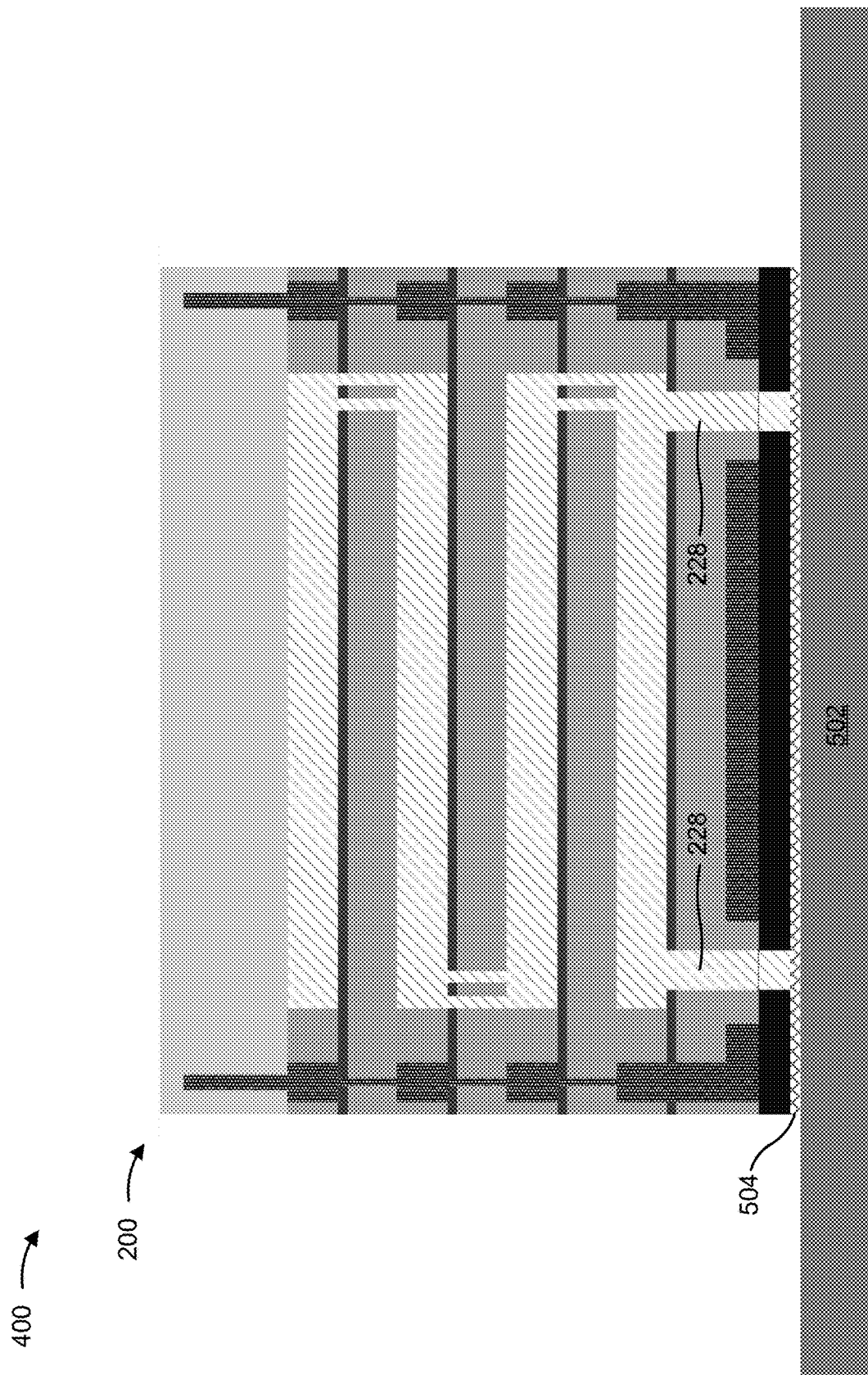

As shown in FIG. 5B, the substrate 202 may be thinned in order to remove a portion of the substrate 202 from the back side of the semiconductor device 200. For example, the planarization tool 110 may perform a wafer thinning process remove a portion of the substrate 202 from the back side of the semiconductor device 200. In some implementations, the planarization tool 110 may grind the substrate 202 to thin the substrate 202 on the back side of the semiconductor device 200 after the semiconductor device 200 is affixed to the platform 502.

Figure 5C:
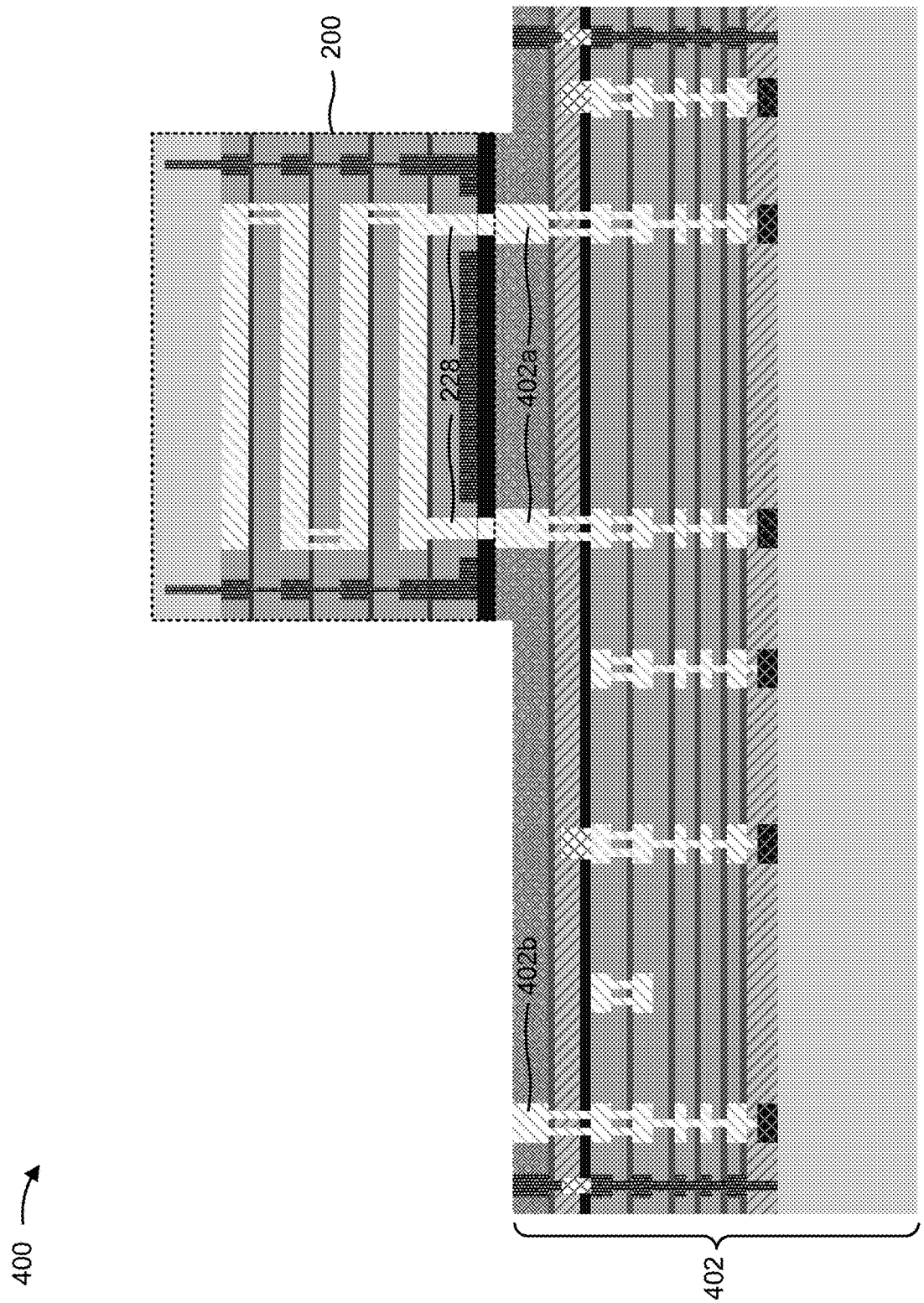

As shown in FIG. 5C, the semiconductor device 200 may be affixed to the semiconductor device 402 after the wafer thinning process is performed to remove the portion of the substrate 202 from the back side of the semiconductor device 200. For example, a bonding process (e.g., a hybrid bonding process, a chip on wafer bonding process, or the like) may be performed to bond the semiconductor device 200 to the semiconductor device 402. As shown, the semiconductor device 200 is bonded to the semiconductor device 402 such that the connective structures 228 of the semiconductor device 200 are connected to the connective structures 402a of the semiconductor device 402.

Figure 5D:
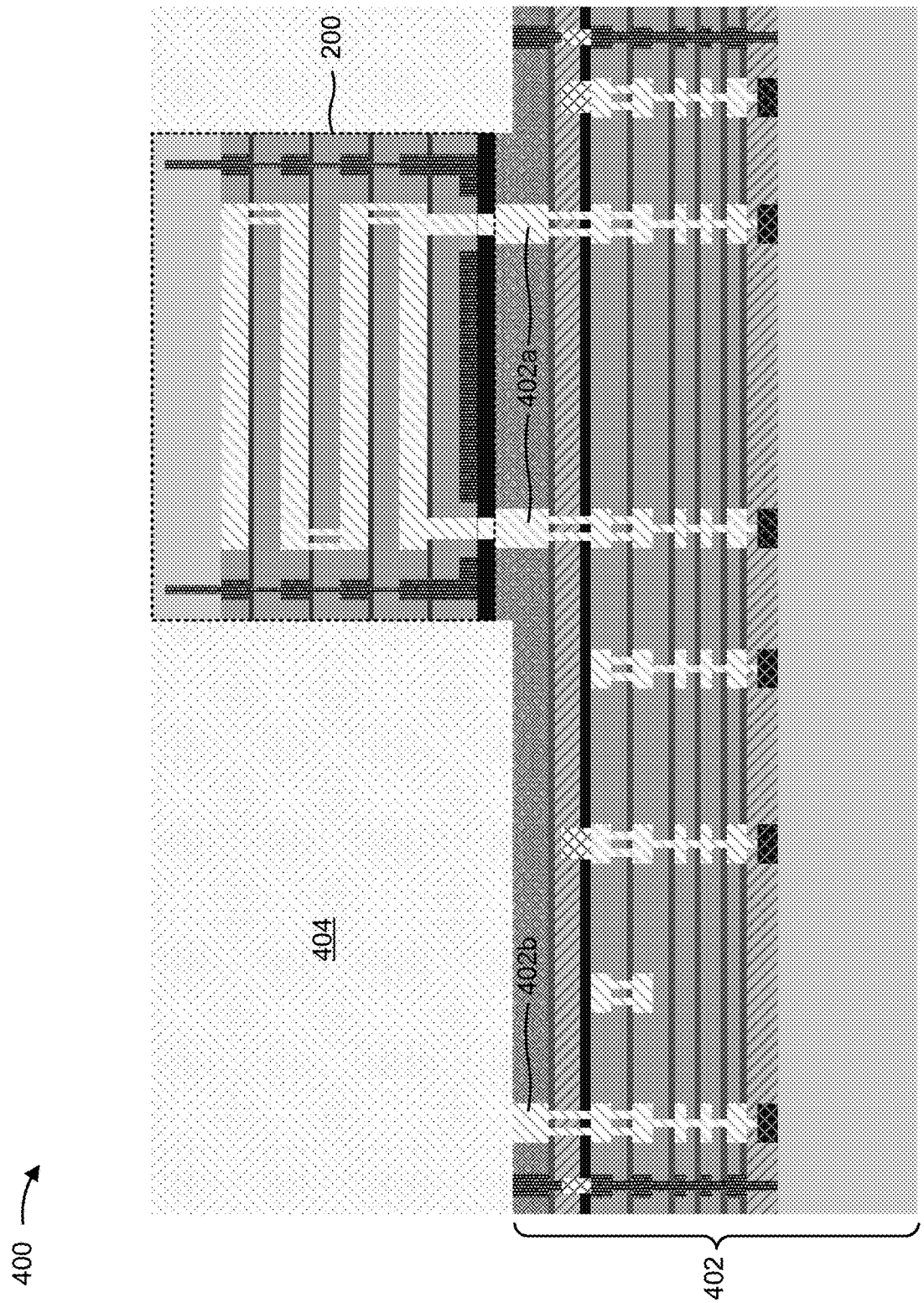

As shown in FIG. 5D, the dielectric material 404 may be formed around the semiconductor device 200 and over the semiconductor device 402. For example, the deposition tool 102 may deposit the dielectric material 404 around the semiconductor device 200 and on the semiconductor device 400 using a CVD process, a PVD process, an ALD process, or another type of deposition process. In some implementations, after the dielectric material 404 is deposited, the planarization tool 110 performs a polishing process (e.g., a CMP process) to remove excess dielectric material and planarize a surface of the dielectric material 404 and the semiconductor device 200.

Figure 5E:
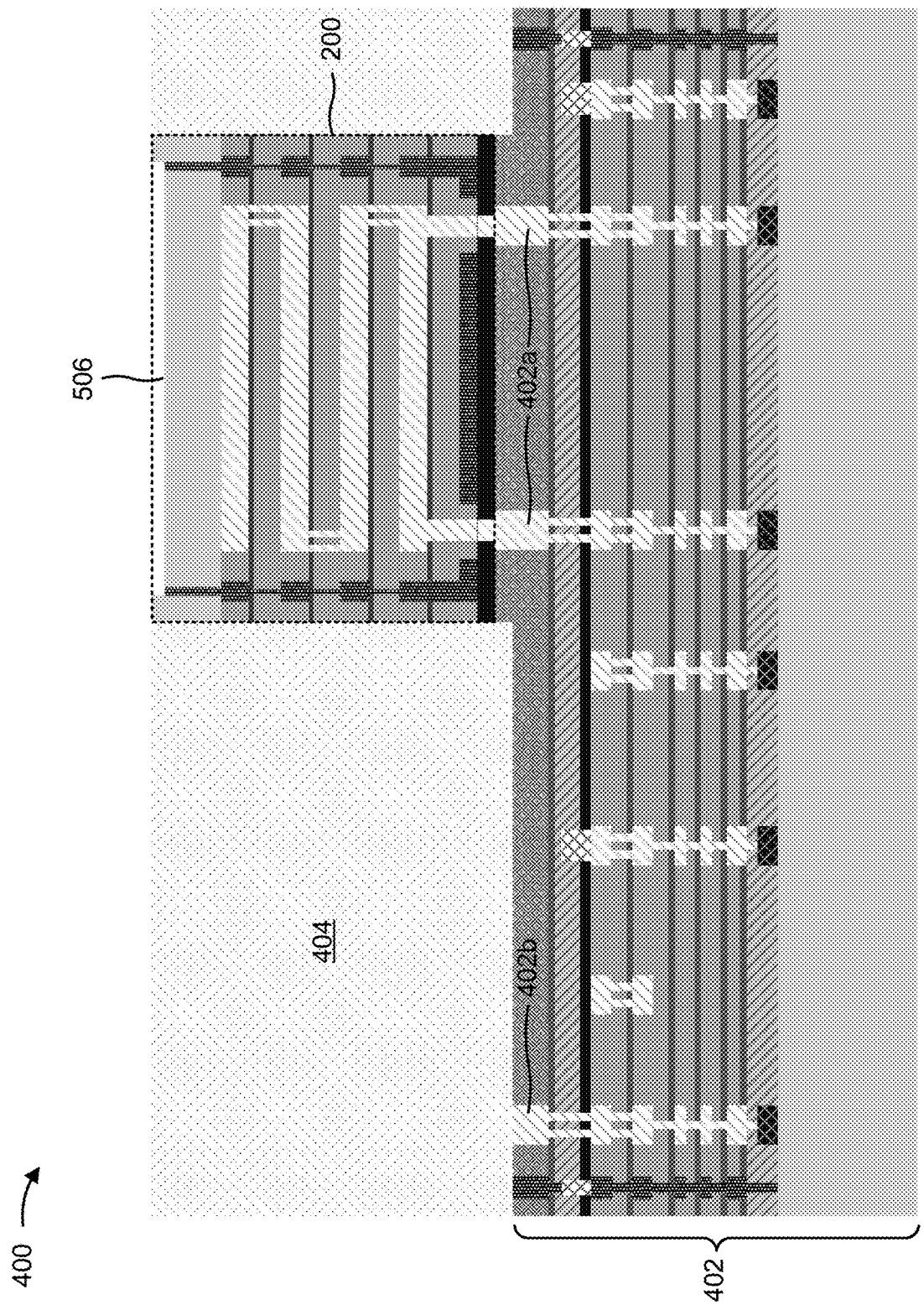

As shown in FIG. 5E, a recess 506 may be formed in the substrate 202. As described below, the recess 506 is a recess in which a shielding structure layer 204h is to be formed. In some implementations, as shown, the recess 506 may be formed over the inductance structure 206 of the semiconductor device 200. In some implementations, the recess 506 extends through a portion of the substrate to the shielding structure layer 204a in the substrate 202. In some implementations, to form the recess 506, the deposition tool 102 may deposit a photoresist layer on the substrate 202. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the substrate 202 based on the pattern formed in the photoresist layer to form the recess 506. For example, the etch tool 108 may perform a dry etching technique (e.g., using an RIE process), a wet etching technique, or another type of etching technique. The remaining portions of the photoresist layer may be removed after the substrate 202 is etched to form the recess 506.

Figure 5F:
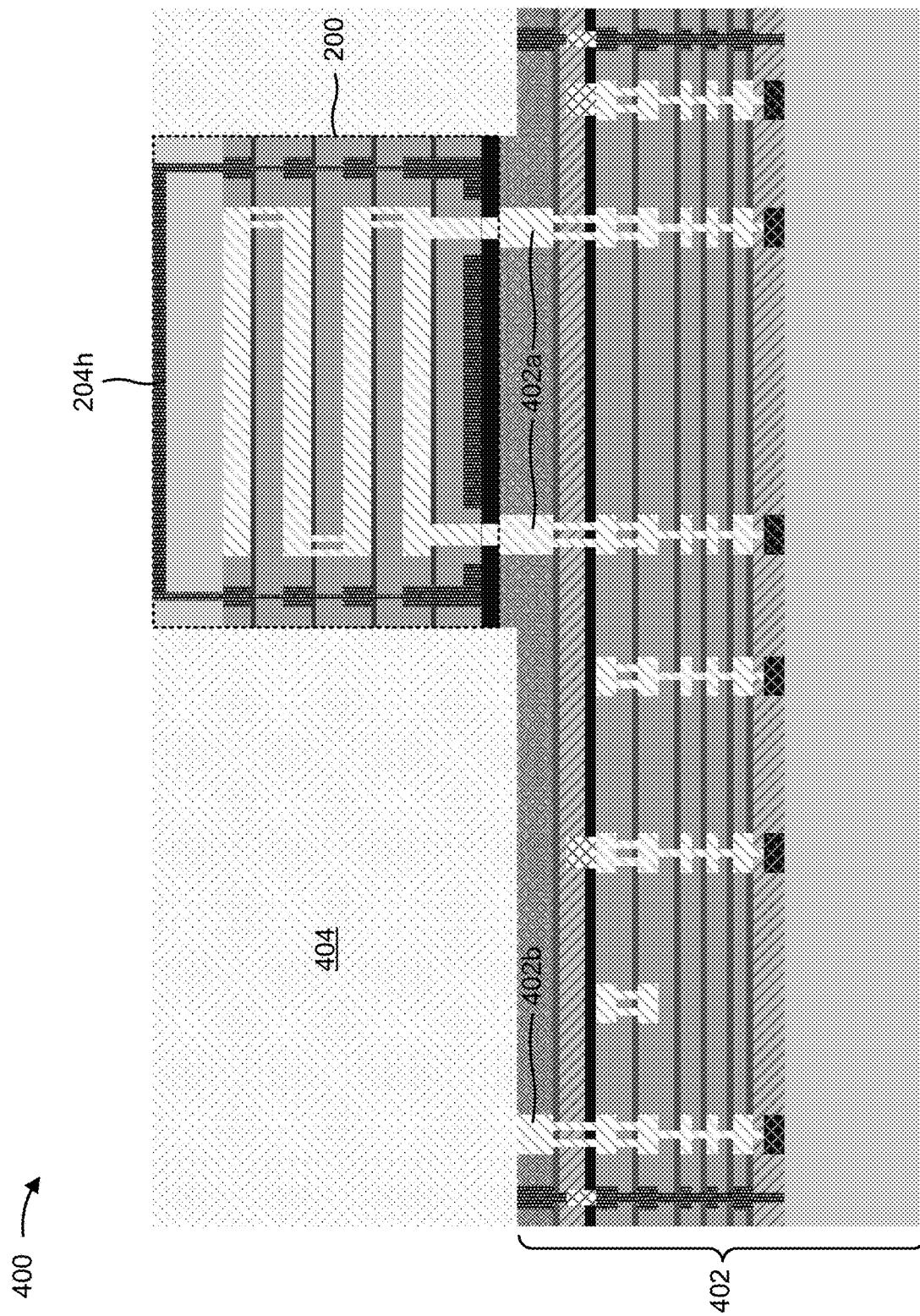

As shown in FIG. 5F, the shielding structure layer 204h may be formed in the recess 506. For example, the deposition tool 102 may first deposit a barrier layer (not shown) by sputtering a barrier layer material in the recess 506 and on an exposed surface of the substrate 202. Next, the deposition tool 102 may deposit a seed layer (not shown) by sputtering a seed layer material on the barrier layer. Next, the plating tool 116 may perform an electro plating process (e.g., an ECP process) to fill the recess 506 with plating material. After the plating is performed, the planarization tool 110 performs a polishing process (e.g., a CMP process) to remove excess plating material, thereby forming the shielding structure layer 204h in the recess 506. Notably, after formation of the shielding structure layer 204h, one or more portions of the shielding structure 204 (e.g., formed by shielding structure layers 204a-f) are around the sides of the inductance structure 206, one or more portions of the shielding structure 204 (e.g., formed by the shielding structure layer 204g) are below the semiconductor device (e.g., between the semiconductor device 200 and the semiconductor device 402), and one or more portions of the shielding structure 204 (e.g., formed by the shielding structure layer 204h) is above the semiconductor device 200.

Figure 5G:
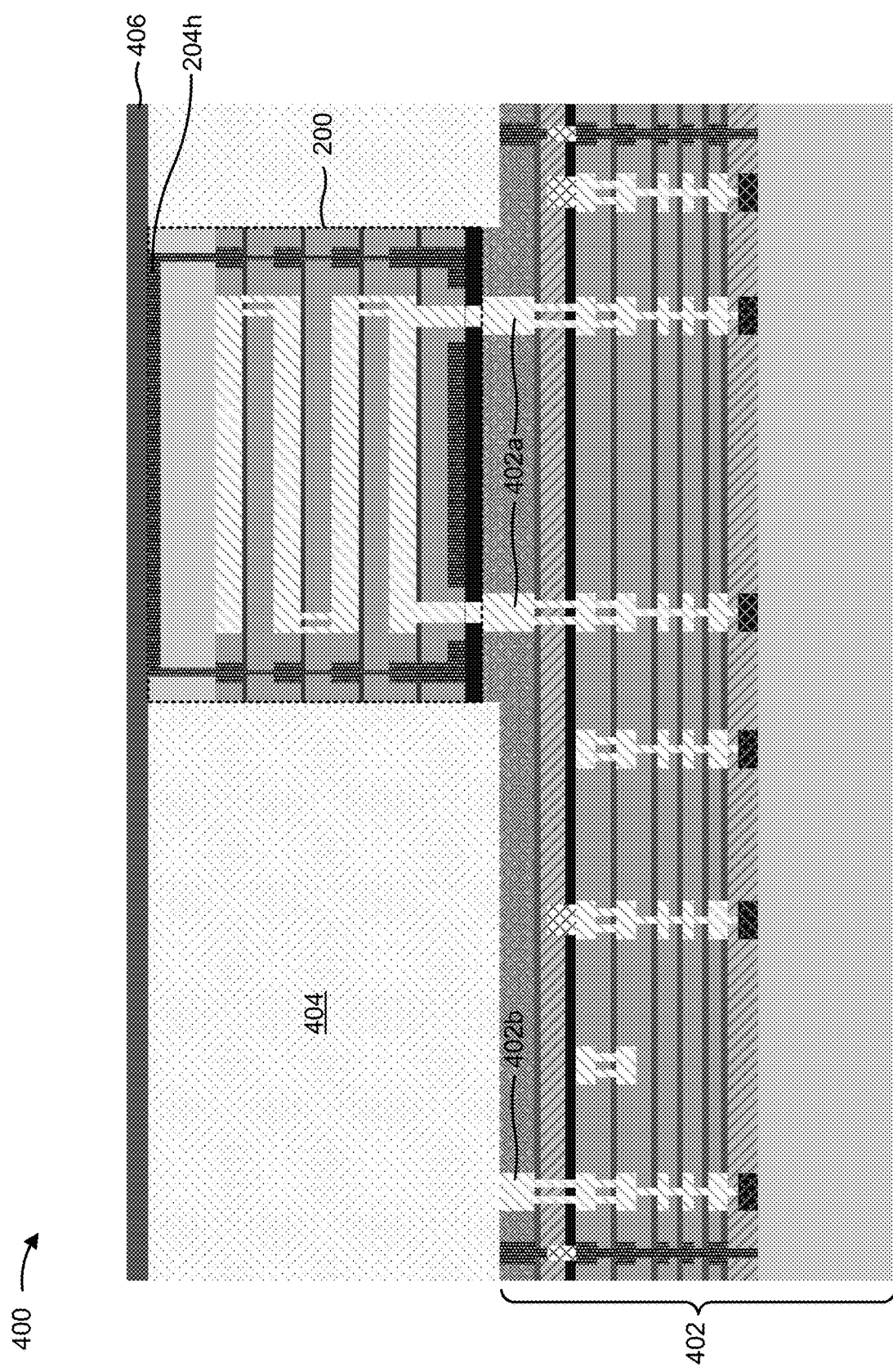

As shown in FIG. 5G, the capping layer 406 may be formed on the shielding structure layer 204h, the dielectric material 404, and exposed surfaces of the substrate 202. For example, the deposition tool 102 may deposit the capping layer 406 on the shielding structure layer 204h, the dielectric material 404, and exposed surfaces of the substrate 202 using a CVD process, a PVD process, an ALD process, or another type of deposition process.

Figure 5H:
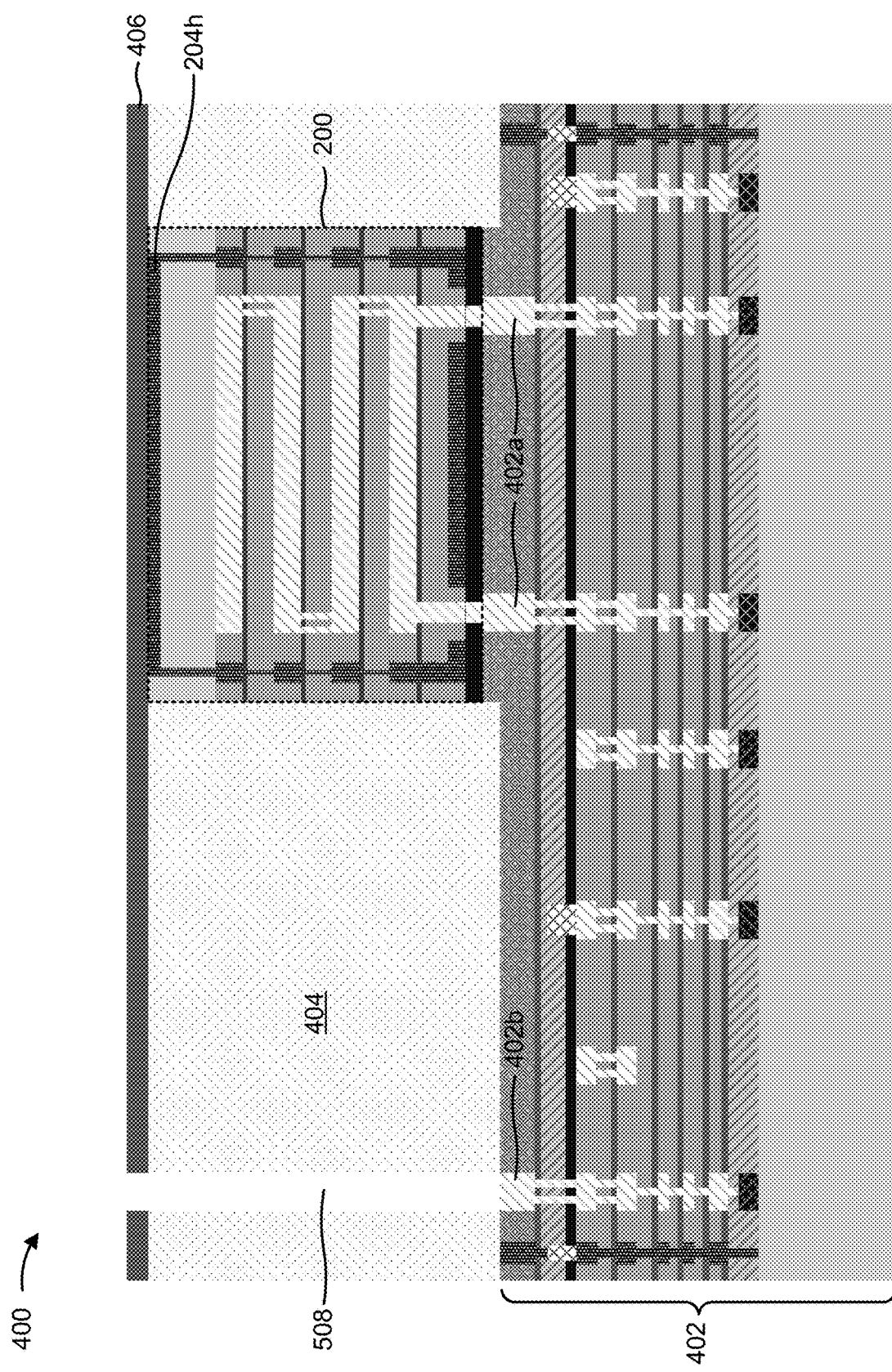

As shown in FIG. 5H, a recess 508 may be formed through the capping layer 406 and the dielectric material 404. As described below, the recess 508 is a recess in which the conductive structure 408 is to be formed. In some implementations, as shown, the recess 508 may be formed over the connective structure 402b of the semiconductor device 402. In some implementations, the recess 508 extends through the capping layer 406 and the dielectric material 404 to the connective structure 402b. In some implementations, to form the recess 508, the deposition tool 102 may deposit a photoresist layer on the substrate 202. The exposure tool 104 may form a pattern in the photoresist layer by exposing the photoresist layer to a radiation source to transfer the pattern from a photomask to the photoresist layer. The developer tool 106 may perform a development operation that includes one or more techniques to develop the pattern in the photoresist layer. The etch tool 108 may etch the capping layer 406 and the dielectric material 404 based on the pattern formed in the photoresist layer to form the recess 508. For example, the etch tool 108 may perform a dry etching technique (e.g., using an RIE process), a wet etching technique, or another type of etching technique. The remaining portions of the photoresist layer may be removed after the capping layer 406 and the dielectric material 404 are etched to form the recess 508.

Figure 5I:
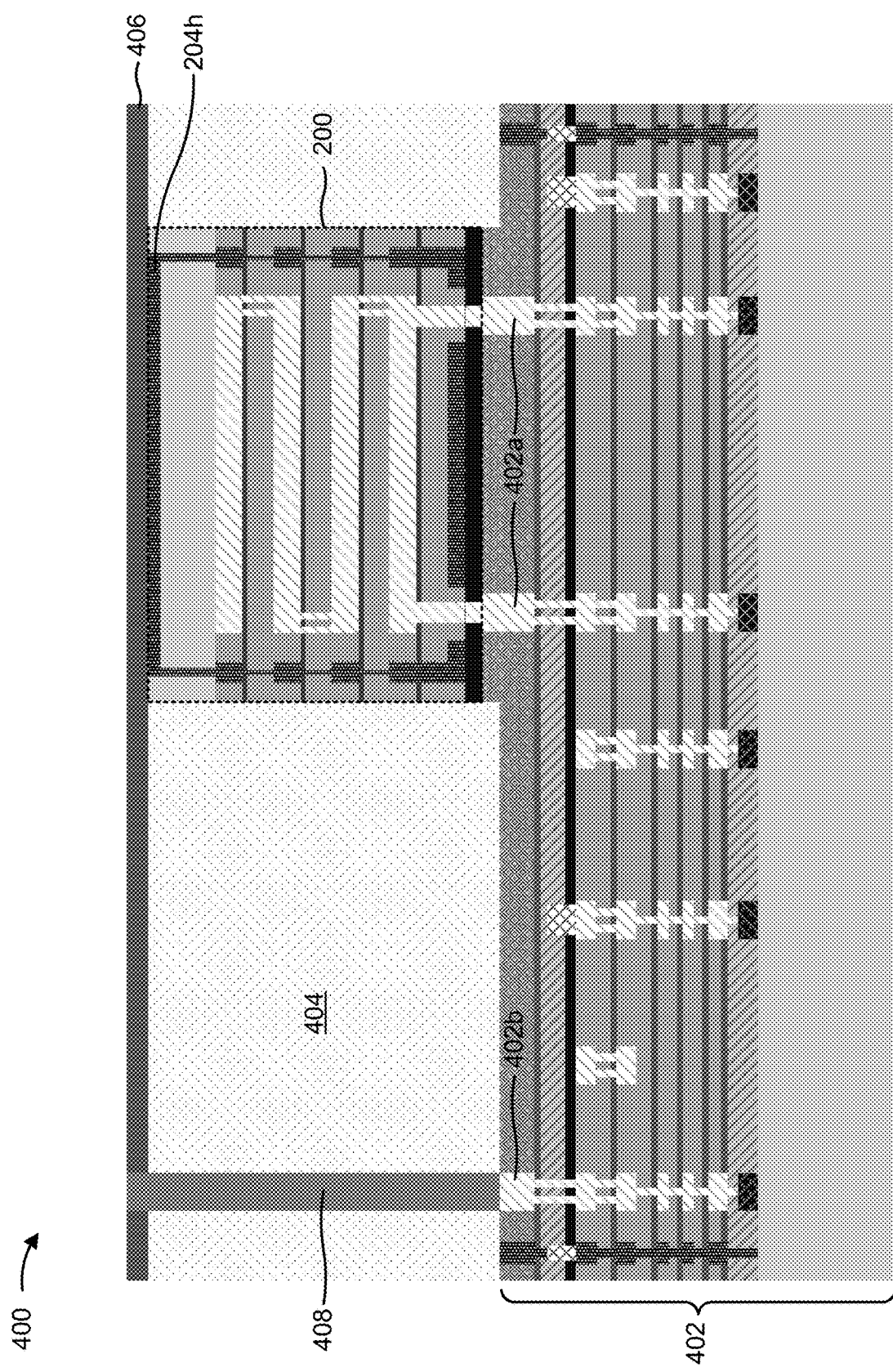

As shown in FIG. 5I, the conductive structure 408 may be formed in the recess 508. For example, the deposition tool 102 may first deposit a barrier layer (not shown) by sputtering a barrier layer material in the recess 508. Next, the deposition tool 102 may deposit a seed layer (not shown) by sputtering a seed layer material on the barrier layer. Next, the plating tool 116 may perform an electro plating process (e.g., an ECP process) to fill the recess 508 with plating material. After the plating is performed, the planarization tool 110 performs a polishing process (e.g., a CMP process) to remove excess plating material, thereby forming the conductive structure 408 in the recess 508.

Figure 5J:
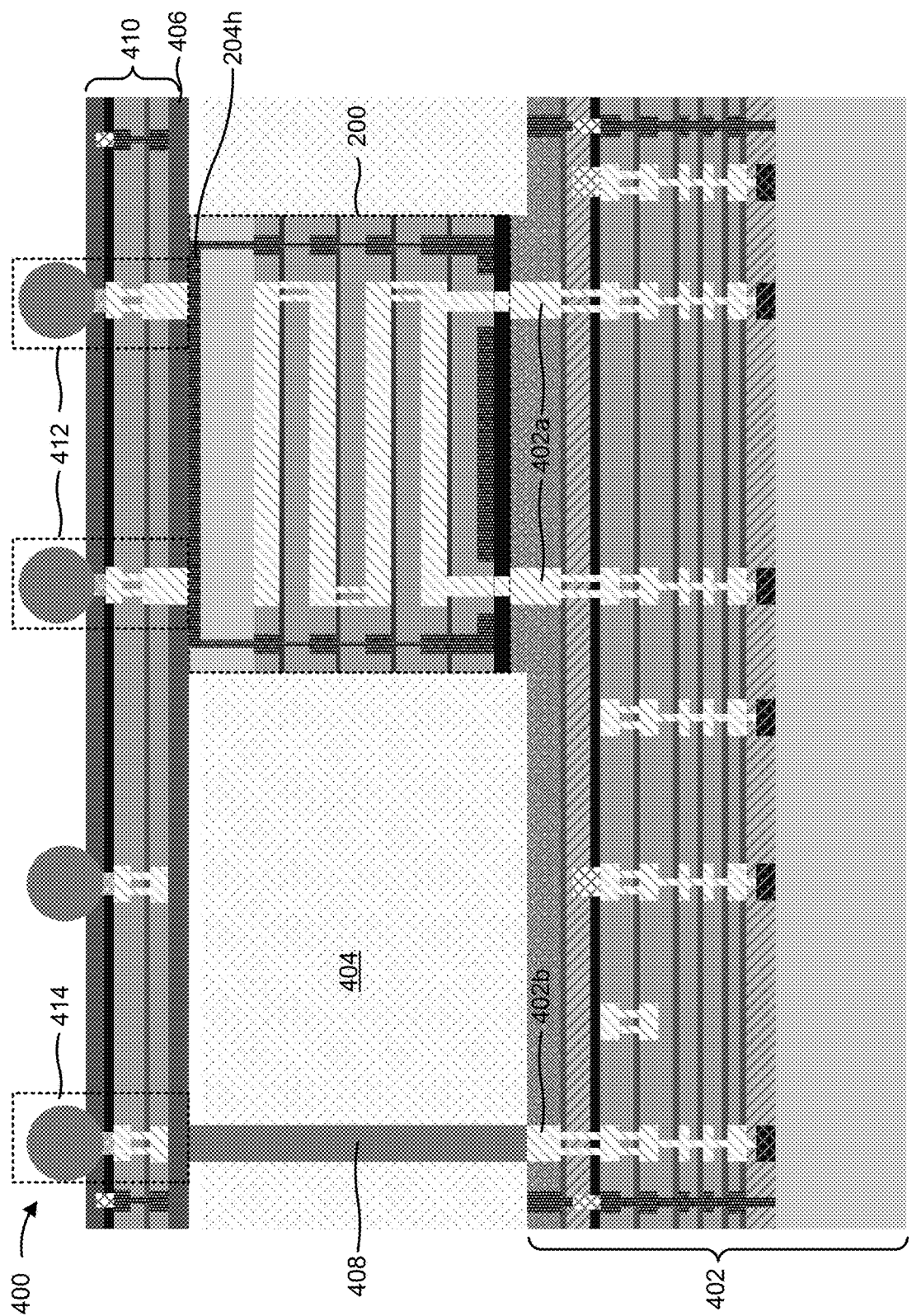

As shown in FIG. 5J, the passivation structure 410, the set of connective structures 412, and the connective structure 414 may be formed above the capping layer 406. For example, the passivation structure 410, the set of connective structures 412, and the connective structure 414 may be formed using one or more of the semiconductor processing tools 102-116 (e.g., using the deposition tool 102, the exposure tool 104, the developer tool 106, the etch tool 108, the planarization tool 110, the plating tool 116, or the like), using techniques similar to those described above. In some implementations, as shown, the set of connective structures 412 is formed such that the set of connective structures 412 is connected to the shielding structure layer 204h (e.g., such that the shielding structure 204 can be connected to external circuitry). Similarly, the connective structure 414 is formed such that the connective structure 414 is connected (through the conductive structure 408) to the connective structure 402b of the semiconductor device 402 (e.g., such that the semiconductor device 402 can be connected to external circuitry).

As indicated above, FIGS. 5A-5J are provided as a series of example operations for forming the semiconductor device 400. In practice, a series of operations used to form the semiconductor device 400 may include additional operations, fewer operations, different operations, or differently ordered operations than those described with regard to FIGS. 5A-5J.

Figure 6A:
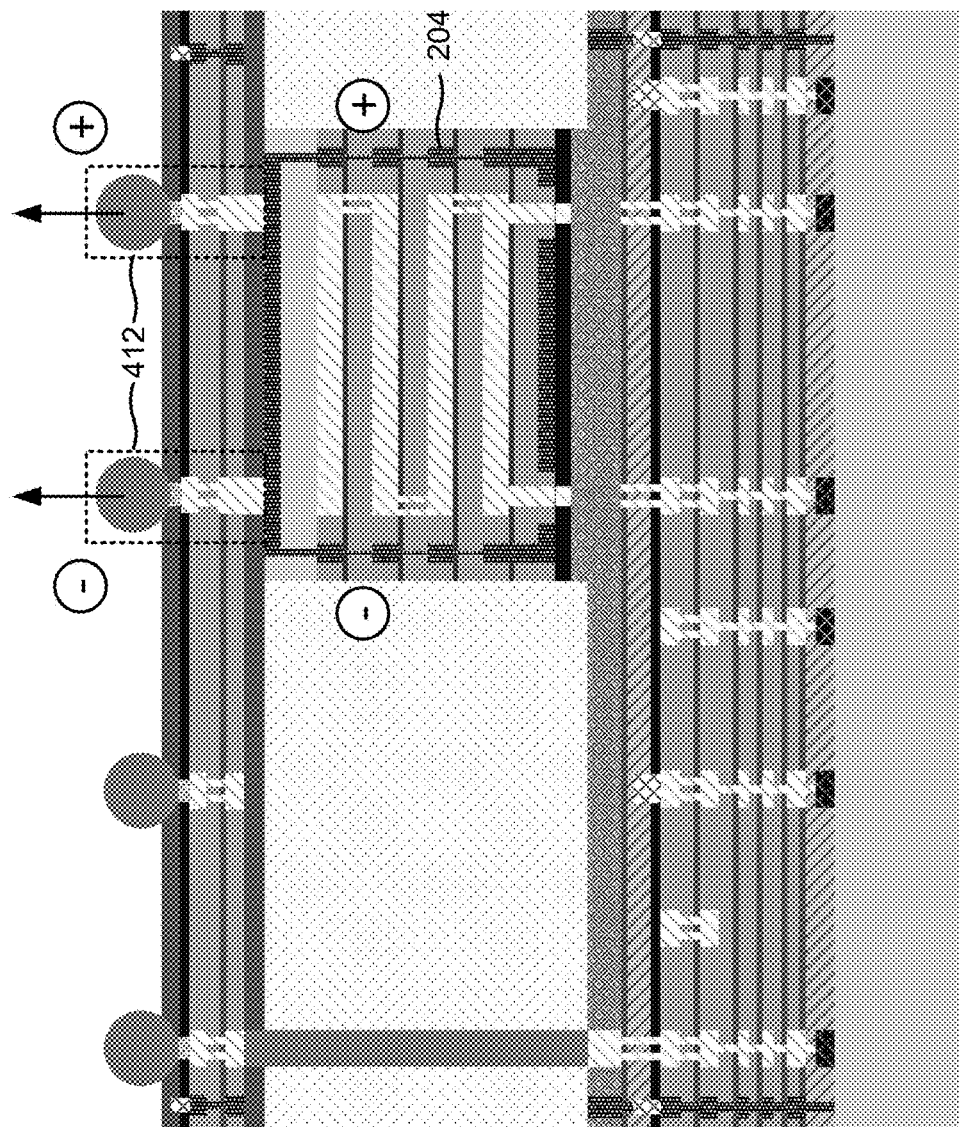
FIGS. 6A and 6B are diagrams of example implementations of a semiconductor device described herein.
Figure 6B:
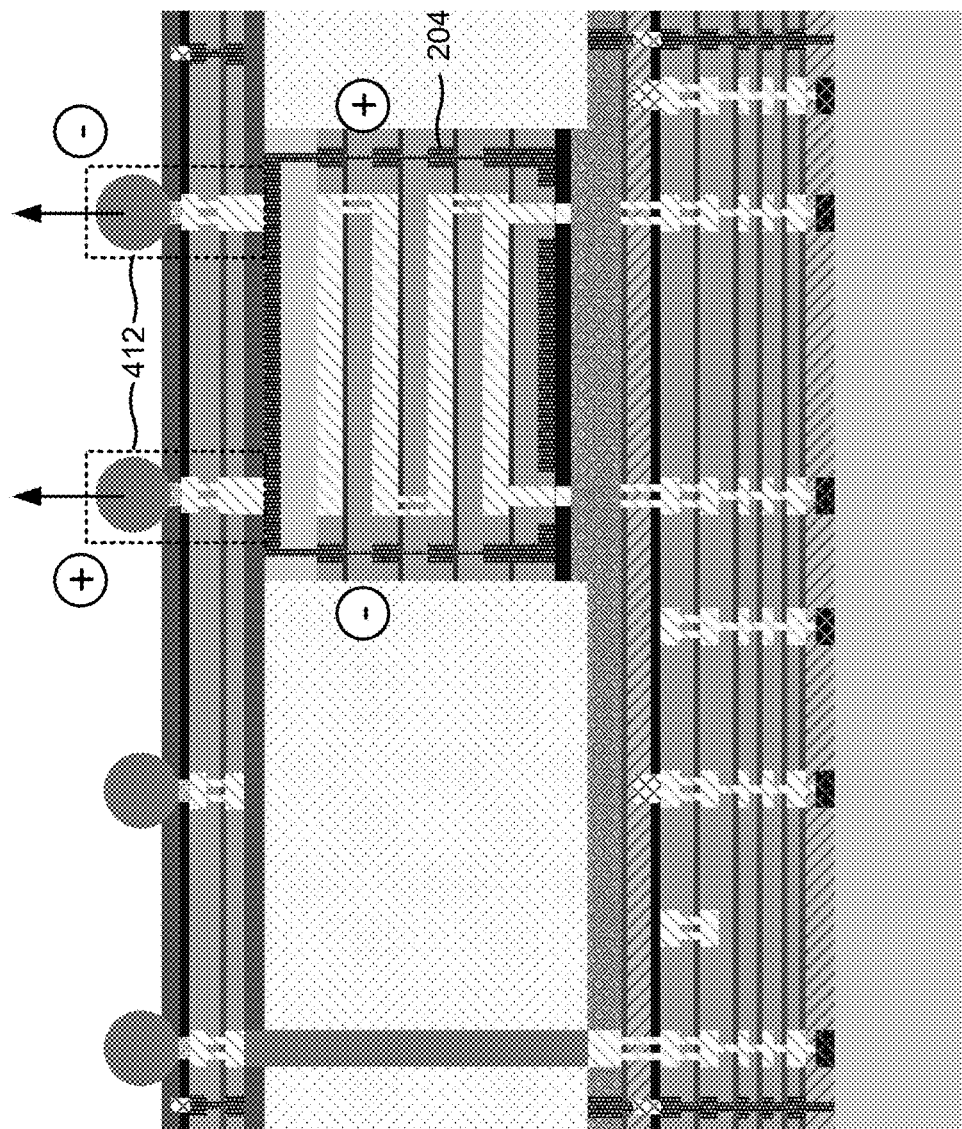

FIGS. 6A and 6B are diagrams of example implementations of the semiconductor device 400. In some implementations, the shielding structure 204 of the semiconductor device 400 may be connected to a ground, an example of which is illustrated in FIG. 6A. For example, the shielding structure 204 may be connected to a ground through the connective structures 412 and external circuitry. In some implementations, the shielding structure 204 is connected to the ground in order to dissipate an electric charge on the shielding structure 204 (e.g., a charge induced on the shielding structure 204 by external EM fields).

Alternatively, in some implementations, the shielding structure 204 of the semiconductor device 400 may be connected to a reverse voltage source, an example of which is shown in FIG. 6B. For example, the shielding structure 204 may be connected to a reverse voltage source through the connective structures 412 and external circuitry. In some implementations, the shielding structure 204 is connected to the reverse voltage source in order to neutralize an electric charge on the shielding structure 204 (e.g., a charge induced on the shielding structure 204 by external EM fields). In some implementations, a connection to a reverse voltage source may be used when the external EM fields have a strength that makes grounding insufficient (e.g., such that the charge on the shielding structure 204 needs to be neutralized rather than shunted).

In some implementations, an effect of connecting the shielding structure 204 to a ground or to a reverse voltage source is to balance polarization on the shielding structure 204 or to reduce a charging effect on the shielding structure 204 caused by external EM fields.

As indicated above, FIGS. 6A and 6B are provided as examples. Other examples may differ from what is described with regard to FIGS. 6A and 6B.

Figure 7:
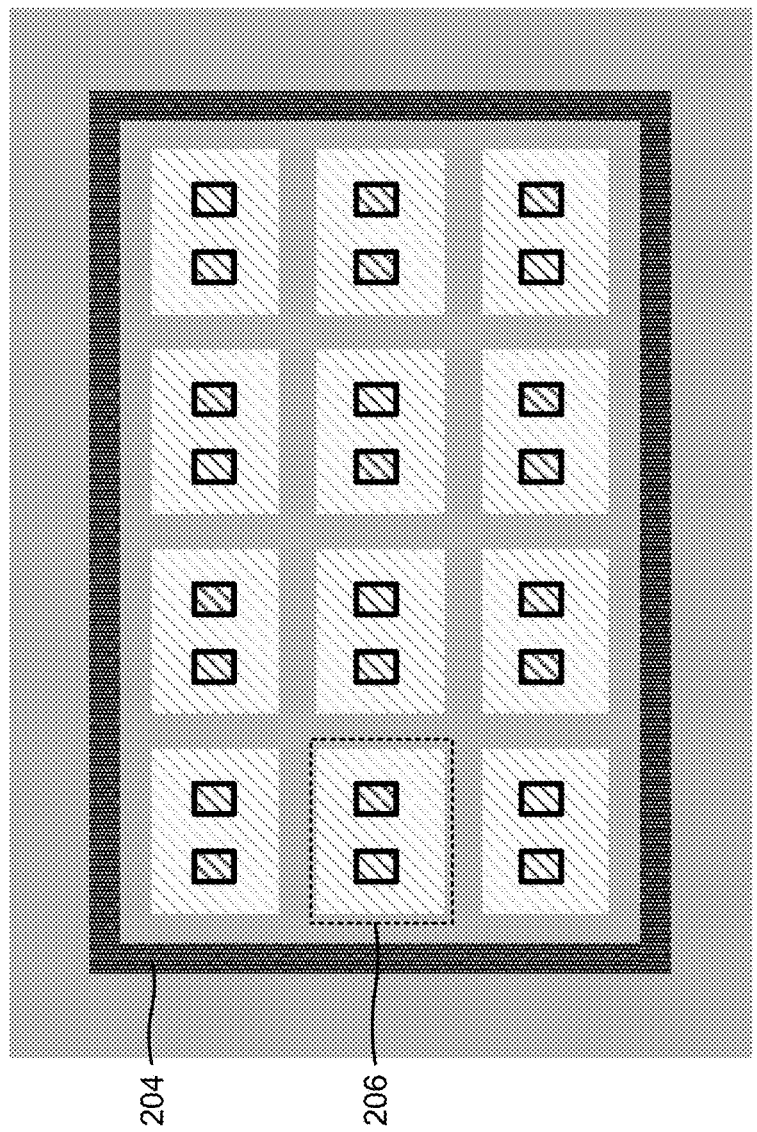
FIG. 7 is a diagram of an example semiconductor device described herein.

FIG. 7 is a diagram of an example semiconductor device 700 that includes a shielding structure 204 that at least partially shields multiple inductance structures 206 from external EM fields. The semiconductor device 200 and the semiconductor device 400 described above include a shielding structure 204 that at least partially shields a single inductance structure 206 from external EM fields. However, in some implementations, the shielding structure 204 may be arranged so that the shielding structure 204 at least partially shields multiple inductance structures 206 from external EM fields, as illustrated in FIG. 7.

As shown in FIG. 7, the semiconductor device 700 includes twelve inductance structures 206, where the shielding structure 204 is arranged to at least partially shield each of the twelve inductance structures 206 from external EM fields. In some implementations, as shown in FIG. 7, the shielding structure 204 in the semiconductor device 700 is arranged such that the shielding structure 204 is around a perimeter of the group of the twelve inductance structures 206 of the semiconductor device 700. In this way, a single shielding structure 204 can at least partially prevent charges from being induces in the multiple inductance structures 206 by the external EM fields, thereby improving performance of the multiple inductance structures 206. While not shown in FIG. 7, the shielding structure 204 in the semiconductor device 700 can include horizontal portions (e.g., formed by the shielding structure layer 204g or the shielding structure layer 204h) in addition to, or as an alternative to, the vertical portions (e.g., formed by the shielding structure layers 204a-204f) illustrated in FIG. 7. In some implementations, the semiconductor device 700 may formed using a sequence of operations similar to those described above in association with FIGS. 3A-3U and 5A-5J.

As indicated above, FIG. 7 is provided as an example. Other examples may differ from what is described with regard to FIG. 7.

Figure 8:
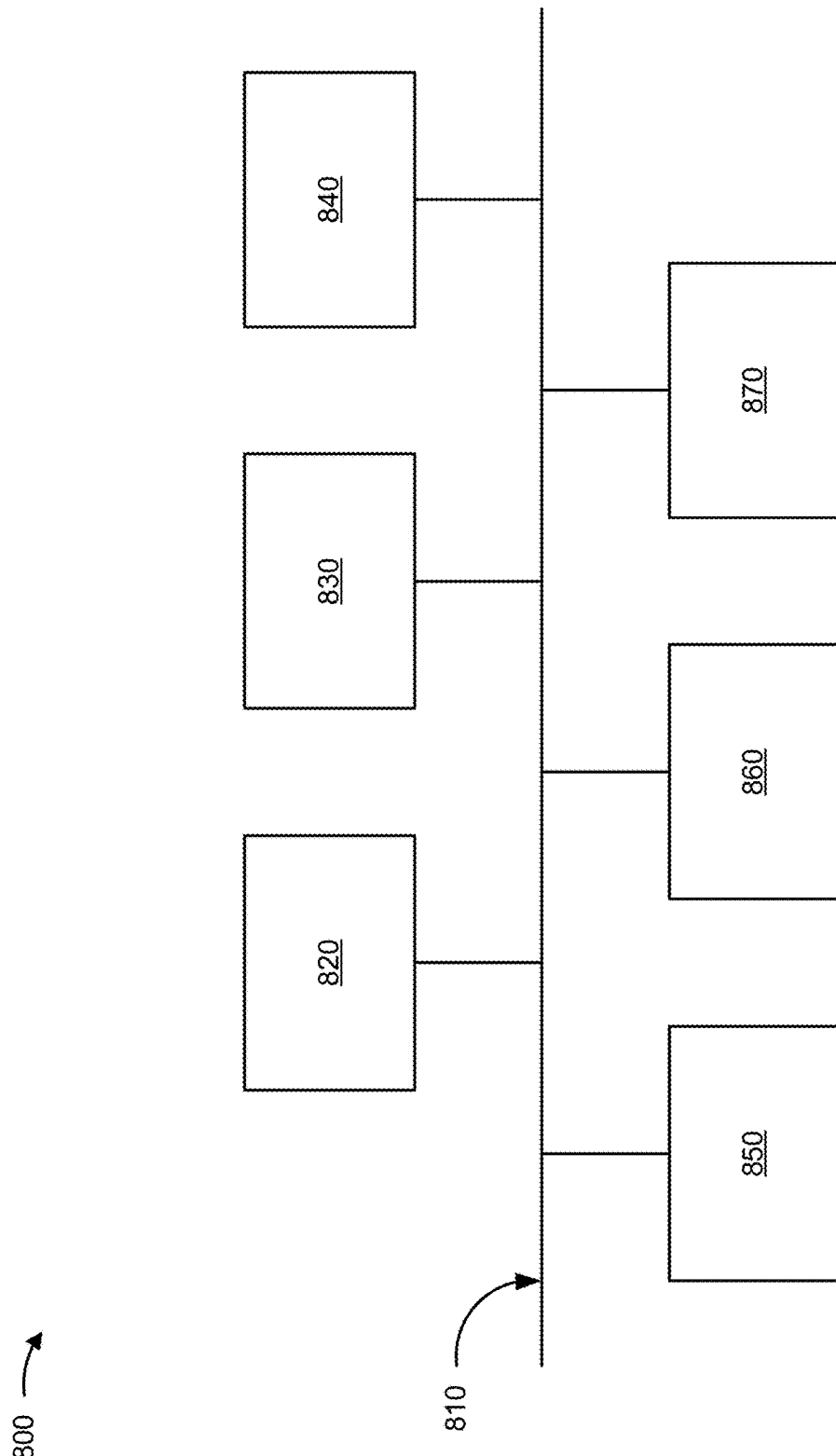
FIG. 8 is a diagram of example components of one or more devices of FIG. 1.

FIG. 8 is a diagram of example components of a device 800. In some implementations, one or more of the semiconductor processing tools 102-116 and/or the wafer/die transport tool 118 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
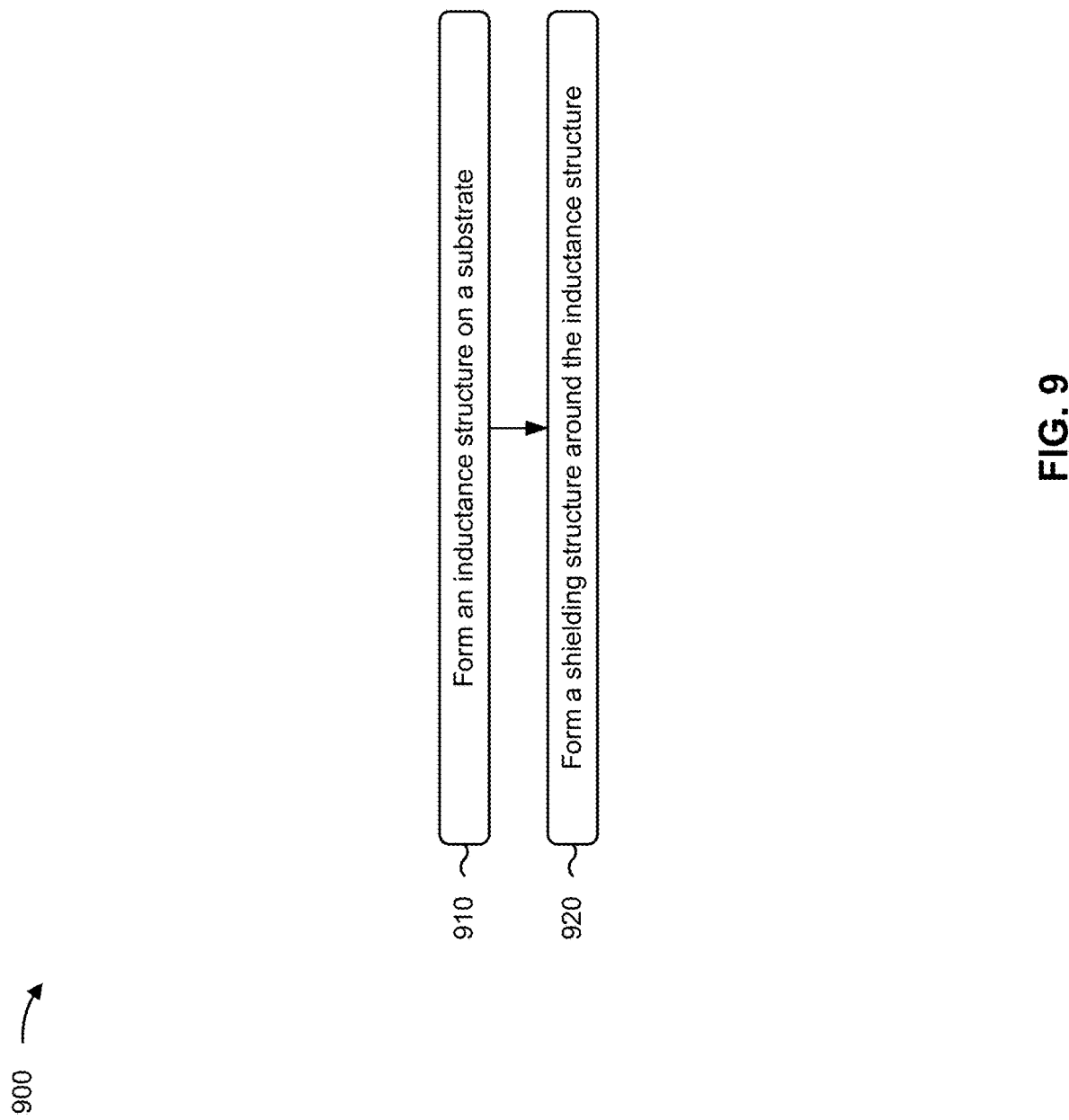
FIG. 9 is a flowchart of an example process relating to forming an electromagnetic (EM) shielding structure for a semiconductor device.

FIG. 9 is a flowchart of an example process 900 relating to forming semiconductor devices described herein (e.g., the semiconductor device 200, the semiconductor device 400, or the like). In some implementations, one or more process blocks of FIG. 9 may be performed by one or more semiconductor processing tools (e.g., one or more of the semiconductor processing tools 102-116). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming an inductance structure on a substrate (block 910). For example, the one or more semiconductor processing tools may form an inductance structure (e.g., inductance structure 206) on a substrate (e.g., substrate 202), as described above.

As further shown in FIG. 9, process 900 may include forming a shielding structure around the inductance structure (block 920). For example, the one or more semiconductor processing tools may form a shielding structure (e.g., shielding structure 204) around the inductance structure, as described above. In some implementations, the shielding structure includes a plurality of vertical shielding structure portions (e.g., shielding structure portions 204a-204f). In some implementations, each vertical shielding structure portion of the plurality of vertical shielding structure portions is at least partially around a perimeter of the inductance structure. In some implementations, forming a vertical shielding structure portion of the plurality of vertical shielding structure portions comprises forming one or more recesses in a layer, and filling the one or more recesses with a conductive material to form the vertical shielding structure portion.

Process 900 may include additional implementations, such as any single implementation or any combination of implementations described below and/or in connection with one or more other processes described elsewhere herein.

In a first implementation, process 900 includes forming a horizontal shielding structure portion (e.g., shielding structure portion 204g) above a first surface of the inductance structure.

In a second implementation, alone or in combination with the first implementation, the horizontal shielding structure portion is a first horizontal shielding structure portion, and the method further includes forming a second horizontal shielding structure portion (e.g., shielding structure portion (e.g., 204h) above a second surface of the inductance structure.

In a third implementation, alone or in combination with one or more of the first and second implementations, process 900 includes forming a connective structure (e.g., connective structure 414) above the shielding structure, the connective structure providing an electrical connection to the shielding structure.

In a fourth implementation, alone or in combination with one or more of the first through third implementations, the inductance structure is a first inductance structure, and the method further comprises forming a second inductance structure (e.g., a second inductance structure 206) on the substrate, wherein each vertical shielding structure portion of the plurality of vertical shielding structure portions is at least partially around a perimeter of the second inductance structure.

In a fifth implementation, alone or in combination with one or more of the first through fourth implementations, process 900 includes affixing a semiconductor device (e.g., semiconductor device 200) including the inductance structure and the shielding structure to another semiconductor device (e.g., semiconductor device 402) such that the inductance structure is electrically connected to the other semiconductor device.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a shielding structure can be arranged to at least partially shield an inductance structure from external EM fields. For example, as described herein, the shielding structure can include one or more shielding structure portions arranged along one or more sides of the inductance structure such that the shielding structure is around at least a portion of a perimeter of the inductance structure. Here, the shielding structure serves to at least partially shield the inductance structure from external EM fields, thereby improving performance of the inductance structure (e.g., with respect to noise reduction or current stabilization provided by the inductance structure).

As described in greater detail above, some implementations described herein provide a semiconductor device. The semiconductor device includes an inductance structure. The semiconductor device includes a shielding structure arranged to at least partially shield the inductance structure from external EM fields. The shielding structure includes a shielding structure portion arranged along a side of the inductance structure such that the shielding structure portion is around at least a portion of a perimeter of the inductance structure.

As described in greater detail above, some implementations described herein provide a method. The method includes forming an inductance structure on a substrate. The method includes forming a shielding structure around the inductance structure, the shielding structure including a vertical shielding structure portion, the vertical shielding structure portion being at least partially around a perimeter of the inductance structure. Forming the vertical shielding structure portion includes forming one or more recesses in a layer, and filling the one or more recesses with a conductive material to form the vertical shielding structure portion.

As described in greater detail above, some implementations described herein provide a semiconductor device. The semiconductor device includes a first semiconductor device including, an inductance structure, and a shielding structure to at least partially prevent electrical charges from being induced in the inductance structure by external EM fields. At least one portion of the shielding structure is along a side of the inductance structure. The semiconductor device includes a second semiconductor device, where the first semiconductor device is affixed to the second semiconductor device such that the inductance structure is electrically connected to the second semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first recess and a second recess in a dielectric layer above a substrate, wherein a portion of the dielectric layer remains between the first recess and the second recess;
    forming an inductance structure in the first recess; and
    forming a first shielding structure comprising a first shielding structure portion having a first width, and a second shielding structure portion having a second width different from the first width, wherein at least one of the first shielding structure portion or the second shielding structure portion is formed in the second recess.

2. The method of claim 1, further comprising forming a second shielding structure above a first surface of the inductance structure.

3. The method of claim 2, further comprising forming a third horizontal shielding structure above a second surface of the inductance structure.

4. The method of claim 1, further comprising forming a connective structure above the first shielding structure, the connective structure providing an electrical connection to the first shielding structure.

5. The method of claim 1, wherein the inductance structure is a first inductance structure, and wherein the method further comprises:
    forming a second inductance structure on the substrate, wherein the first shielding structure is at least partially around a perimeter of the second inductance structure.

6. The method of claim 1, further comprising affixing a semiconductor device including the inductance structure and the first shielding structure to another semiconductor device such that the inductance structure is electrically connected to the other semiconductor device.

7. The method of claim 1, where the first shielding structure is formed around the inductance structure.

8. The method of claim 1, wherein forming the first shielding structure comprises:
    filling the second recess with a conductive material to form the first shielding structure.

9. The method of claim 1, wherein the first shielding structure is formed after forming the inductance structure.

10. A method, comprising:
    forming a first recess and a second recess in a dielectric layer above a substrate;
    forming an inductance structure in the first recess; and
    forming a shielding structure comprising:
        a first shielding structure portion having a first width arranged along a side of the inductance structure and at least partially within the substrate, and
        a second shielding structure portion having a second width different from the first width comprising openings through which a connective structure is arranged,
        wherein at least one of the first shielding structure portion or the second shielding structure portion is formed in the second recess.

11. The method of claim 10, wherein the shielding structure is formed around an entire perimeter of the inductance structure.

12. The method of claim 10, wherein the shielding structure comprises a third shielding structure portion arranged above the inductance structure.

13. The method of claim 10, wherein the shielding structure comprises a third shielding structure portion below the inductance structure and in the substrate.

14. The method of claim 10, wherein the shielding structure is connected to a ground to dissipate an electric charge on the shielding structure.

15. The method of claim 10, wherein forming the shielding structure comprises:
    filling the second recess with a conductive material to form the shielding structure.

16. A method, comprising:
    forming a first recess and a second recess in a dielectric layer on a substrate;
    forming an inductance structure in the first recess; and
    forming a shielding structure, to at least partially shield the inductance structure from external electromagnetic (EM) fields, comprising a first shielding structure portion having a first width, and a second shielding structure portion having a second width different from the first width,
        wherein at least one of the inductance structure and the shielding structure is at least partially within a substrate, and
        wherein at least one of the first shielding structure portion or the second shielding structure portion is formed in the second recess.

17. The method of claim 16, wherein the shielding structure is formed around an entire perimeter of the inductance structure.

18. The method of claim 16, wherein the shielding structure comprises a third shielding structure portion arranged above the inductance structure.

19. The method of claim 16, wherein the first shielding structure portion is below the inductance structure.

20. The method of claim 16, wherein the shielding structure is connected to a ground to dissipate an electric charge on the shielding structure.

* * * * *